(12) United States Patent
Mizushima et al.

(10) Patent No.: US 10,444,992 B2
(45) Date of Patent: Oct. 15, 2019

(54) STORAGE DEVICE, APPARATUS HAVING STORAGE DEVICE, AND STORAGE CONTROL METHOD

(71) Applicant: HITACHI, LTD., Tokyo (JP)

(72) Inventors: Nagamasa Mizushima, Tokyo (JP); Junji Ogawa, Tokyo (JP); Atsushi Kawamura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 407 days.

(21) Appl. No.: 15/110,310

(22) PCT Filed: Feb. 26, 2014

(86) PCT No.: PCT/JP2014/054643
§ 371 (c)(1),
(2) Date: Jul. 7, 2016

(87) PCT Pub. No.: WO2015/128955
PCT Pub. Date: Sep. 3, 2015

(65) Prior Publication Data
US 2016/0328154 A1   Nov. 10, 2016

(51) Int. Cl.
G06F 3/00 (2006.01)
G06F 3/06 (2006.01)
G11C 7/10 (2006.01)

(52) U.S. Cl.
CPC .......... G06F 3/0604 (2013.01); G06F 3/067 (2013.01); G06F 3/0665 (2013.01); G11C 7/1006 (2013.01)

(58) Field of Classification Search
None
See application file for complete search history.

(56) References Cited

U.S. PATENT DOCUMENTS

| 6,256,232 B1 | 7/2001 | Chang et al. |
| 2009/0138671 A1 | 5/2009 | Danilak |
| 2012/0102260 A1 | 4/2012 | Kawamura et al. |

FOREIGN PATENT DOCUMENTS

| JP | 05-324485 A | 12/1993 |
| JP | 2006-065424 A | 3/2006 |
| JP | 2011-034370 A | 2/2011 |
| JP | 2011-505046 A | 2/2011 |
| JP | 2013-532853 A | 8/2013 |

Primary Examiner — David Yi
Assistant Examiner — Craig S Goldschmidt
(74) Attorney, Agent, or Firm — Volpe and Koenig, P.C.

(57) ABSTRACT

A storage device provides a logical space based on a storage medium that is configured by a plurality of logical areas to the higher-level apparatus, and a base data range exists in the storage medium for each logical area. The storage device reads the base data from the base data range that is corresponded to a write destination logical area to which the write destination logical address belongs, and creates difference data that is an exclusive OR of first data that is the base data and second data that is any one of data based on write data and the write data. The storage device creates compressed difference data by compressing the difference data, writes the compressed difference data to the storage medium, and associates a difference data range that is a range in which the compressed difference data has been written with the write destination logical area.

15 Claims, 14 Drawing Sheets

| Logical page address | Base data | | Difference flag | Difference data | | Duplication flag | Code part address |
|---|---|---|---|---|---|---|---|
| | Address | Size | | Address | Size | | |
| L0 | P0[2] | 5 | ON | P2[0] | 2 | OFF | — |
| L1 | P1[0] | 11 | OFF | — | — | ON | P3[0] |
| L2 | P3[4] | 8 | OFF | — | — | OFF | — |
| L3 | P1[0] | 11 | OFF | — | — | ON | P3[2] |
| L4 | P1[0] | 11 | ON | P0[13] | 1 | ON | P3[3] |
| L5 | P2[5] | 10 | OFF | — | — | OFF | — |
| L6 | P0[7] | 6 | OFF | — | — | OFF | — |
| L7 | P1[0] | 11 | OFF | — | — | ON | P3[1] |
| ... | ... | ... | ... | ... | ... | ... | ... |

| Base data address | Share count |
|---|---|
| ... | ... |
| P1[0] | 4 |
| ... | ... |

480, 490

FIG. 15A
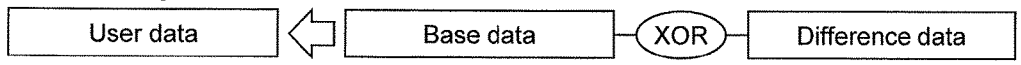
FIG. 15B
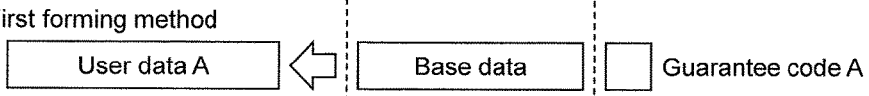
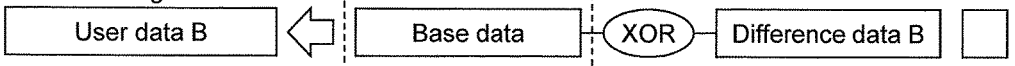
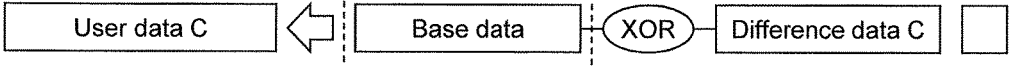
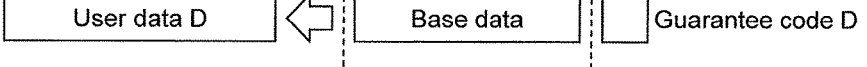
FIG. 16
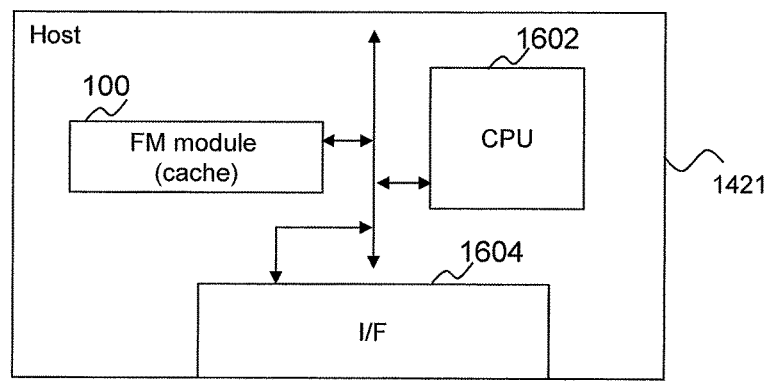

STORAGE DEVICE, APPARATUS HAVING STORAGE DEVICE, AND STORAGE CONTROL METHOD

TECHNICAL FIELD

The present invention generally relates to a storage control, for example, a control for reducing an amount of data that is written to a storage medium in a storage device.

BACKGROUND ART

A storage device generally has a storage medium and a medium controller that is configured to control an I/O (Input/Output) of data to the storage medium. As an apparatus that includes the storage device, for example, there is a storage apparatus or a host apparatus that is configured to carry out an I/O of data to the storage apparatus.

As a storage medium, for example, a non-volatile semiconductor memory that is erasable in a lump has been developed. As such a non-volatile semiconductor memory, for example, there is a flash memory. The flash memory (typically a NAND-type flash memory) includes a plurality of blocks, and each block includes a plurality of pages. I/O of data is carried out on a page basis, and data is erased on a block basis. An erasure time is shorter than a write time. An update of recorded data (data that has been written) of the flash memory is generally carried out as follow. That is, the medium controller reads the recorded data (pre-update data) from a page, creates update data by reflecting the write target data to at least a part of the recorded data, writes the updated data to an empty page, and invalidates a page storing the recorded data (a processing for disabling a reference from an higher-level apparatus of the storage device). In the case where an empty page is depleted, the medium controller erases data from a block in which all pages are invalid pages (invalidated pages), thereby making an invalid pages to be empty pages.

Each page includes a plurality of (for example, 16) sectors. Since the writing processing is carried out in a page unit, even if only one sector is rewritten, it is necessary to rewrite one page that includes the sector.

For the flash memory, an erasure count of data is generally limited. For a block in which rewriting of data is concentrated and an erasure count is increased, an erasure of data cannot be carried out, whereby the block cannot be used. Consequently, it is necessary to prevent the data erasure processing from being concentrated to a specific block. Moreover, for the flash memory, errors of data in a page are increased with time. Consequently, the medium controller carries out an operation called refresh for migrating data after the elapse of a certain period of time after being rewritten to another page.

For the flash memory that has the above characteristics, it is thought that a deduplication technique such as Patent Literature 1 is used in order to shorten an erasure time of data and to reduce an erasure count of data. The deduplication technique is a technique for corresponding a plurality of logical address spaces (for example, logical pages) storing duplicated data to one physical address space (for example, a physical page) storing the data in the case where logical addresses that are provided to an higher-level apparatus and physical addresses of an actual storage area are corresponded to each other to be managed. By using the deduplication technique, an amount of data that is written to a storage medium can be reduced and an operating life of the flash memory can be tried to be lengthened for the storage device in which the flash memory is operated as a storage medium.

CITATION LIST

Patent Literature

[PTL 1]
Japanese Unexamined Patent Application Publication No. 2013-532853

SUMMARY OF INVENTION

Technical Problem

For the deduplication technique that is disclosed in Patent Literature 1, a writing amount (an amount of data that is written to a flash memory) is reduced by allocating one physical page to a plurality of logical pages having duplicated data. However, when a slight data update to each of the logical pages is just carried out, data in each logical page of an update destination deviates from a target of the deduplication, and a new physical page in which update data has been written is allocated to each logical page of an update destination. As a result, a writing amount is increased.

The problem of this kind is not limited to logical pages that have been deduplicated. For example, when a slight data update is just carried out to a logical page that has not been deduplicated, the update data is written to a new physical page (that is, a physical page is consumed newly).

Moreover, the problem of this kind may occur to not only a flash memory but also storage media of other kinds in which an erasure count (a rewrite time count) is limited.

A purpose of the present invention is to reduce an amount of data that is written to a storage medium of a storage device.

Solution to Problem

A storage device comprises a storage medium and a medium controller that is configured to control an I/O to the storage medium and to provide a logical space based on the storage medium to the higher-level apparatus. The logical space is configured by a plurality of logical areas. A base data range exists in the storage medium for each logical area. The medium controller receives a write command that specifies a write destination logical address from the higher-level apparatus and reads the base data from the base data range that is corresponded to a write destination logical area to which the write destination logical address belongs. The medium controller creates difference data that is an exclusive OR of first data that is the base data and second data that is any one of data based on write data that conforms to the write command and the write data. The medium controller creates compressed difference data by compressing the difference data, writes the compressed difference data to the storage medium, and associates a difference data range that is a range in which the compressed difference data has been written with the write destination logical area. In the case where the medium controller receives a read command in which a logical area that is the same as the write destination logical area is a read source from the higher-level apparatus, the medium controller can restore read data that conforms to the read command based on the base data that is associated with a read source logical area and the difference data that is associated with a read source logical area.

Advantageous Effects of Invention

An amount of data that is written to a storage medium in a storage device can be reduced, thereby providing for a longer operating life of the storage medium.

BRIEF DESCRIPTION OF DRAWINGS

FIG. 4A is a view showing an address conversion table.

FIG. 4B is a view showing a duplication count table.

FIG. 15A is a view showing the forming methods of two kinds for user data of an isolated allocation page.

FIG. 15B is a view showing the forming methods of two kinds for user data of a duplication allocation page.

FIG. 16 is a view showing a configuration of a host.

DESCRIPTION OF EMBODIMENTS

An embodiment of the present invention will be described below in detail.

In the following descriptions, while the information in accordance with the present invention will be described in the expression such as "kkk table" in some cases, the information can be represented by the data structure other than a table. In order to indicate that the information is not depended on a data structure, the expression of "kkk table" can also be referred to as "kkk information" in some cases.

In the following descriptions moreover, a communication interface device is abbreviated as "I/F" and a flash memory is abbreviated as "FM" in some cases.

The following describes an FM module to which a storage device in accordance with an embodiment is applied and a storage apparatus that includes the FM module.

Figure 14:
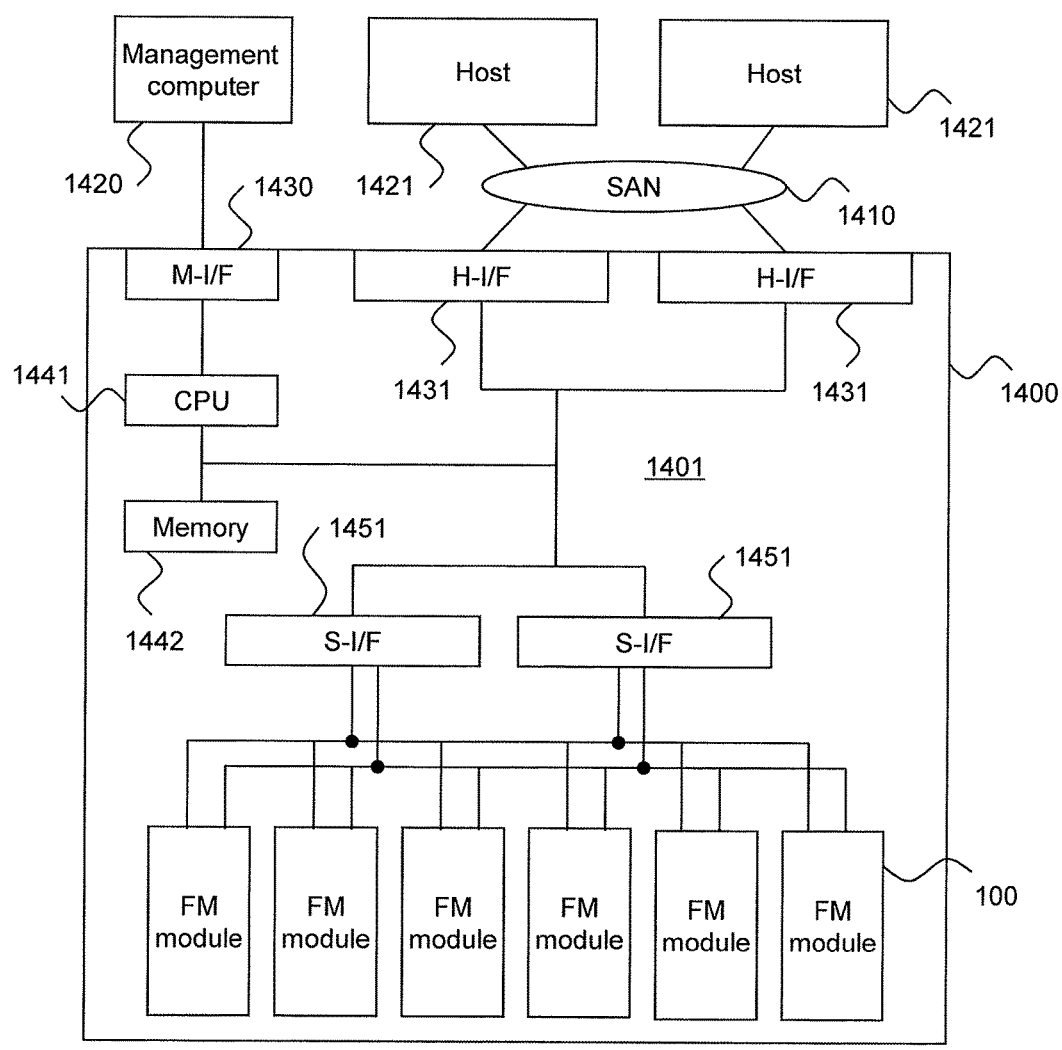
FIG. 14 is a view showing a configuration of a computer system that includes a storage apparatus in accordance with an embodiment of the present invention.

FIG. 14 is a view showing a configuration of a computer system that includes a storage apparatus in accordance with an embodiment of the present invention.

The computer system includes a storage apparatus 1400, a host (a host computer) 1421, and a management computer 1420. The host 1421 may be coupled to the storage apparatus 1400 via a communication network such as a SAN (Storage Area Network) 1410. The management computer 1420 may be coupled to the storage apparatus 1400 via a communication network (not shown) such as a LAN (Local Area Network). The host 1421 and the management computer 1420 may be coupled to the same communication network.

The storage apparatus 1400 includes a plurality of FM modules 100 and a storage controller 1401 that is configured to control an I/O to the plurality of FM modules 100. The storage controller 1401 receives a command that is transmitted from the host 1421, interprets the command, and executes read/write of data in a storage area of the storage apparatus 1400. The storage apparatus 1400 includes an H-I/F (I/F that is configured to communicate with the host 1421) 1431, an S-I/F (I/F that is configured to communicate with the FM module) 1451, an M-I/F (I/F that is configured to communicate with the management computer 1420) 1430, a memory 1442, and a CPU 1441 that is coupled to the above devices.

The H-I/F 1431 is an I/F that is configured to receive an I/O request and a control command that are transmitted from the host 1421. The S-I/F 1451 is an I/F that is configured to transmit data and a control command to the FM module 100. The M-I/F 1430 is an I/F that is configured to receive a control command that is related to a management or maintenance from the management computer 1420.

The CPU 1441 functions as an arithmetic processing unit and includes a function for controlling the whole operation of the storage apparatus 1400 in accordance with a wide variety of programs and arithmetic parameters that are stored in the memory 1442. More specifically, the CPU 1441 processes the input/output of user data (data I/O) between the storage apparatus 1400 and the host 1421 in accordance with an I/O request from the host 1421, issues a write command to the FM module 100 for writing user data to the FM module 100, and issues a read command to the FM module 100 for reading user data from the FM module 100 for example. Moreover, the CPU 1441 creates a guarantee code (described later) to user data that has been received from the host 1421 and gives the guarantee code to the user data. The memory 1442 stores the management information in addition to a wide variety of programs and arithmetic parameters. Moreover, the memory 1442 includes a cache memory area. The cache memory area stores user data that is to be written to the FM module 100 and user data that has been read from the FM module 100 on a temporary basis. In the descriptions of the present embodiment, "user data" may be data of a read/write target that conforms to a read/write request (an I/O request) from the host 1421 for the storage controller 1401, and may be data of a read/write target that conforms to read/write request command from the storage controller 1401 for an FM controller 103 (see FIG. 1) in the FM module 100.

Although FIG. 14 shows the configuration that includes six FM modules 100, the number of FM modules 100 is not limited to the example. The internal configuration of the FM module 100 will be described later in detail with reference to FIG. 1. In the present embodiment, the FM module 100 exists in the storage apparatus 1400. However, the configuration is not limited to the example. The FM module 100 can also exist outside the storage apparatus 1400.

The host 1421 is coupled to the storage apparatus 1400 via the SAN 1410, and is configured to transmit a read/write request (an I/O request) of data to the storage apparatus 1400. Moreover, the host 1421 may be a personal computer, a work station, or a mainframe for example. For a communication between the host and the storage apparatus 1400, a block protocol such as an SCSI (Small Computer System Interface) may be used.

The management computer 1420 may be a personal computer, a work station, or a mainframe for example. The management computer 1420 may control the storage apparatus 1400 and so on.

For the configuration shown in FIG. 14, the higher-level apparatus of the FM module 100 is the storage controller 1401. As described later with reference to FIG. 1, the FM module 100 includes a flash memory 105 that is configured by a plurality of FM chips and an FM controller 103 that is configured to control an I/O to the flash memory 105. In the following, an example of features and a handling method of the flash memory 105 will be described.

The flash memory 105 has a feature in which the minimum erasing unit is larger than the minimum writing unit. More specifically, the flash memory 105 (each FM chip) includes a plurality of blocks (physical blocks), and each block includes a plurality of (for example, 256) pages (physical pages). Data is erased in a block unit and the read/write of data is executed in a page unit. A size of a page is, for example, 8640 bytes. Data cannot be directly overwritten to the flash memory 105 based on the characteristics. In other words, in the case where data is rewritten, the FM controller 103 saves other valid data that has been stored in a block that includes the data to another block and erases data from the original block. The FM controller 103 then rewrites data by writing new data to the erased block in a page unit.

As described above, the rewrite processing of data for the flash memory 105 is accompanied by the erasure of data in a block unit (a physical block unit). However, a time that is required for erasing data of one block for the flash memory 105 is longer than a time that is required for writing data of one page (for example, longer by about single digit). Consequently, in the case where the data erasing of one block is executed every time in order to rewrite data of one page, the data rewriting performance of the flash memory 105 is deteriorated. It is necessary to write data with an algorithm that can cover up a time that is required for erasing data from the flash memory 105.

In the case where the rewriting of data is executed to the flash memory 105, data is not erased in every rewriting of data, and the rewriting of data is executed by a method of recording data to an unused page (an empty physical page) in which data has not been recorded. However, in the case where the rewrite processing of data is executed in a repeated manner, an unused page in the flash memory 105 is depleted. Consequently, it is necessary to erase invalid data that has been written to the flash memory 105 (for example, old data after rewriting) and to make a page to be in a reusable state. Therefore, the FM controller 103 copies only valid data in a block that includes old data to an unused page in another block and executes a block recycling processing for erasing data from a block of a copy source and for executing recycling as an unused block. This processing is essential for rewriting data of the flash memory 105 at a high speed. In particular, a block in which there are many invalid data is a block of a copy source on a preferential basis in this processing.

On the other hand, an erasure count of each block of the flash memory 105 is limited. For example, an erasure count of ten thousands per one block is guaranteed. In this case, the rewriting of data is concentrated to one block. In the case where an erasure count of the block then exceeds the guaranteed count (the upper limit), data cannot be erased in some cases and the block cannot be used after that, thereby unfortunately reducing the number of blocks that can be used. Consequently, to prevent the erasure processing from concentrating to a specified block, it is necessary to execute a leveling processing of an erasure count by exchanging the stored data between a block in which an erasure count is large and a block in which an erasure count is small for example.

The flash memory 105 includes a feature in which data errors are increased with the passage of time even in the case where data is held only for a page that has been written once. In order to avoid a data loss caused by a data error, the FM controller 103 adds parity based on an ECC (Error Correction Code) in advance to data that is written to a page. The FM controller 103 reads data after the elapse of a certain period of time after writing, corrects the data by using the parity when data errors are less, executes a refresh processing in which data after a correction is migrated to another page. In the case where this processing is executed, it is also necessary that the FM controller 103 levels the time count of erasing and considers an influence to a performance.

As described above, the FM controller 103 dynamically makes a logical address that is provided to an higher-level apparatus and a physical address of an actual storage area correspond to each other and executes a conversion processing of a logical address to a physical address in data writing in order to cover up an erasure time or to level erasure counts. In other words, by dynamically modifying a correspondence of a logical address that is provided to a higher-level apparatus and a physical address of the flash memory 105 by the FM controller 103, the higher-level apparatus may write data to a logical address space. In such a manner that the higher-level apparatus does not become aware of the modification of a physical address in accordance with the recording to an unused page in data writing, the FM controller 103 manages an address.

In the case where logical addresses and physical addresses are managed by the corresponding for the FM module 100 that includes the flash memory 105, it is effective that a deduplication technique is applied. The deduplication technique is a technique for making a plurality of logical address spaces in which duplicated data has been stored to be corresponded to one physical address space in which the data has been stored. By the deduplication technique, a writing amount of the flash memory 105 can be reduced. As a case in which an application of the deduplication technique is effective in particular, a format processing is thought.

In the case where the storage controller 1401 starts to use the FM module 100, the storage controller 1401 executes the format processing as a purpose of a detection of the abnormal point and an initialization of the stored data. More specifically, for example, the storage controller 1401 writes data of a simple pattern in which specific values are continued (for example, all zero data in which all bits are data of "0") to all storage areas based on the FM module 100. However, the format processing makes a rewriting count to be increased in an undesirable manner for a storage medium in which a rewriting count is limited like the flash memory 105. Since the flash memory 105 adopts a recording method to an unused page for rewriting of data, In the case where a consumption of unused pages is increased, it is necessary to execute a data erasure processing of which a processing time is long on a number of occasions. That is to say, the format processing is a processing in which unused pages are reduced and a performance is deteriorated. In the present embodiment, the deduplication technique is applied to the FM module 100, thereby reducing a writing amount of data and whereby an operating life of the flash memory 105 can be tried to be lengthened. The FM controller 103 can detect that data of a write target is data that is written by the format processing by checking a pattern of data of a write target or a notification from the storage controller 1401 (for example, by setting a value that means a format to a write command from the storage controller 1401).

Moreover, the storage apparatus 1400 can detect the bit corrupting that occurs in user data by a hardware failure, the user data writing to an incorrect address that is generated by an internal control error, and the user data reading from an incorrect address. Consequently, the storage controller 1401 is configured by a plurality of sector data in which user data to be written is divided in a sector unit (for example, 1 sector is 512 bytes) and adds a guarantee code of a predetermined length (for example, 16 bytes) to each sector data. Generally, the guarantee code includes a CRC (Cyclic Redundancy Check) that is calculated from each sector data as a purpose of a detection of the bit corrupting of user data by the CPU 1441. In addition, the guarantee code can include the information related to user data that can be set by a storage apparatus vendor without any inhibition (hereafter referred to as metadata). The metadata may be at least one of the information of a logical stored location of user data for the computer system (more specifically, for example, a logical volume number or a logical sector address), the information of the date and time of an update of user data, and the information of a generation number of user data. The logical volume is a logical storage device that is provided to the host 1421 by the storage apparatus 1400. By an I/O request from the host 1421, a logical address of a logical volume is specified. At least logical page that is provided by each of one or more FM modules 100 is corresponded to an area that conforms to the logical address (an area for a logical volume). A logical address that is specified by an I/O command that is transmitted to the FM module 100 is decided by the storage controller 1401 based on a logical address that is specified by an I/O request.

In the case where the deduplication is tried to be executed to user data that is configured by sector data to which a guarantee code has been added, since guarantee codes are different from each other for every sector data, the deduplication cannot be executed unfortunately in some cases since guarantee codes are different from each other even In the case where sector data has the same value.

Consequently, when the deduplication processing is executed, the FM controller separates the sector data and a guarantee code from user data that includes a guarantee code, makes a collection of sector data only (hereafter referred to as a sector part) to be a target of data sharing in the deduplication, and manages a collection of guarantee codes only (hereafter referred to as a code part) separately from the sector part. The sector part and the code part are stored in the flash memory 105 as independent parts. On the other hand, user data to which the deduplication processing is not executed are not separated into the sector part and the code part, and are stored in the flash memory 105.

In the following descriptions, in the case where data of a physical page that has stored data for a certain logical page is shared as data for other logical page by executing the deduplication processing, the logical page is referred to as a "duplication allocation page". Moreover, in the case where data of a physical page that has stored data for a certain logical page is not shared as data for any one of other logical pages, the logical page is referred to as a "isolated allocation page".

The FM controller 103 reduces a writing amount to the flash memory 105 by compressing data that is stored in the flash memory 105 with the lossless compression algorithm. As the lossless compression algorithm, the LZ77 algorithm is applied for instance. In accordance with this algorithm, the data reduction effect by the compression is high for data that includes many patterns in which the same value (for example, zero) is continued long.

Figure 1:
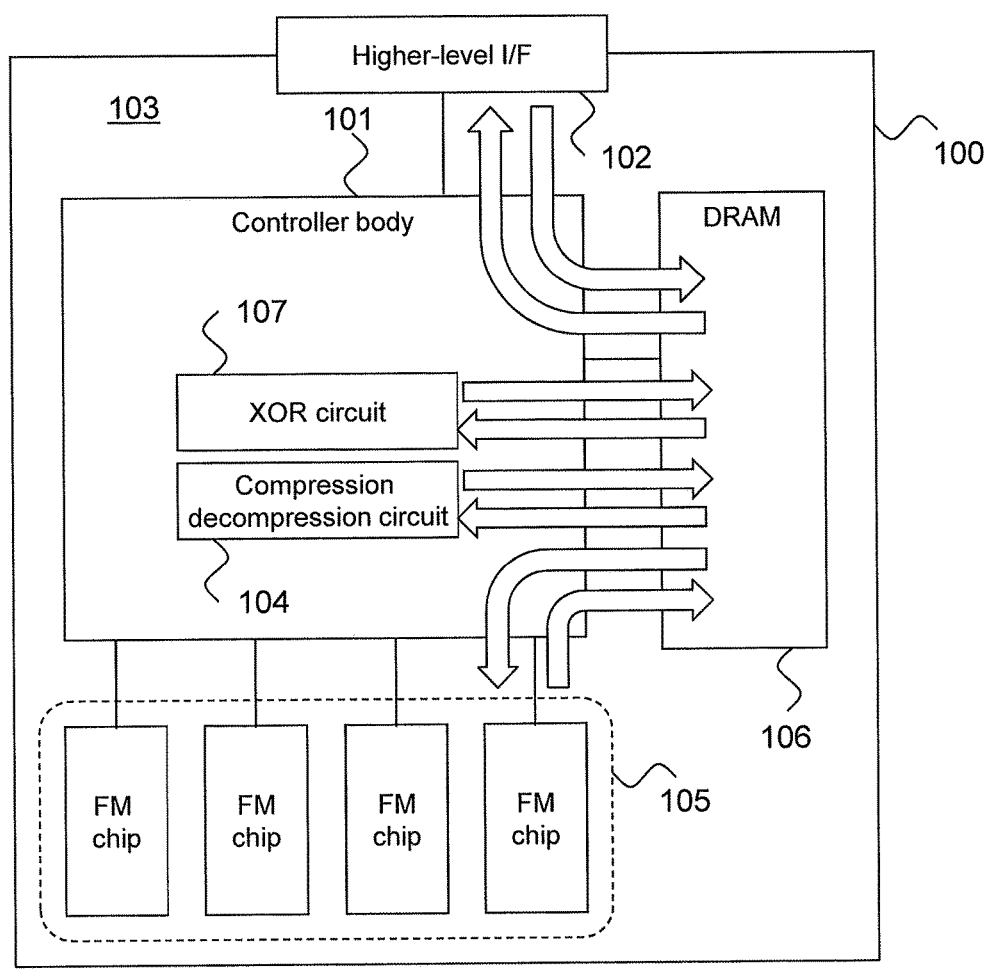
FIG. 1 is a view showing a configuration of an FM module in accordance with an embodiment of the present invention.

The configuration of the FM module 100 will be described with reference to FIG. 1 in the next place.

The FM module 100 includes a flash memory 105 that is configured by a plurality of FM chips and an FM controller 103 that is configured to control the read/write to the flash memory 105. The FM controller 103 includes a higher-level I/F 102 that is coupled to a higher-level apparatus (a storage controller 1401), a DRAM (Dynamic Random Access Memory) 106 that is an example of a memory (such as a volatile memory), and a controller body 101 that is coupled to the above devices. The controller body 101 includes a compression decompression circuit 104 and an XOR circuit 107. The controller body 101 may include a processor (a microprocessor) that is configured to control the higher-level I/F 102, the flash memory 105, and a DRAM 106. The processor can interpret a read/write command that has been received via the higher-level I/F 102, transmit/receive the read/write data, make the compression decompression circuit 104 to execute the compression/decompression of data, make the XOR circuit 107 to execute the exclusive OR operation, and execute the data transfer between the flash memory 105 and a DRAM 106.

The higher-level I/F 102 is configured to receive user data that conforms to a write command that has been issued from the higher-level apparatus and to transmit user data that conforms to a read command that has been issued from the higher-level apparatus to the higher-level apparatus.

The compression decompression circuit 104 may be an arithmetic unit that is mounted as hardware (a logical circuit) in the FM controller 103. The compression decompression circuit 104 can create the compression data (data in a compressed state) by compressing a plain text (data in a plain text state) in a reversible fashion by a predetermined reversible conversion compression algorithm (such as the LZ77 algorithm) and can create the original plain text data by decompressing the compressed data.

The XOR circuit 107 may be an arithmetic unit that is mounted as hardware (a logical circuit) in the FM controller 103. The XOR circuit 107 can calculate an exclusive OR of two data of the same size and create data of the same size as that. The exclusive OR is an operation for creating 0 in the case where there is the equivalent value at the same location of two data, and creating 1 in the case where there are different values at the same location of two data. Consequently, in the case where two data that is input to the XOR circuit 107 are more similar to each other, data that is created is data that includes many patterns in which a zero value is continued long. For such data, a data amount can be greatly reduced by a compression with the above compression algorithm.

The DRAM 106 is configured to store write data that is received from the higher-level apparatus (data that is written to the flash memory 105) and read data that is transmitted to the higher-level apparatus (data that is read from the flash memory 105) on a temporary basis. Moreover, the DRAM 106 functions as a write buffer that temporarily stores data that is written to the flash memory 105. Moreover, the DRAM 106 functions as a read buffer that temporarily stores data that is read from the flash memory 105. Moreover, the DRAM 106 functions as a transmission source of data that is compressed or decompressed by the compression decompression circuit 104 and as a transmission destination of result data of a compression or a decompression (compression data or plain text data). Moreover, the DRAM 106 functions as a transmission source of two data with which an exclusive OR is calculated by the XOR circuit 107 and as a transmission destination of result data that is created by the XOR circuit 107.

Figure 2A:
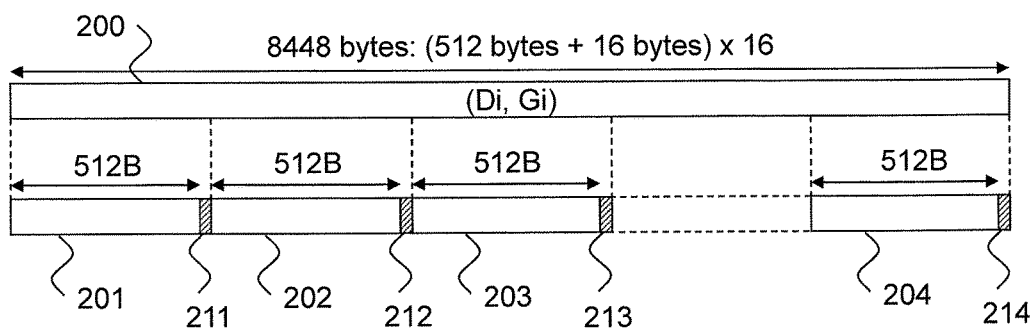
FIG. 2A is a view showing a data format (a plain text state) for a isolated allocation page.
Figure 2B:
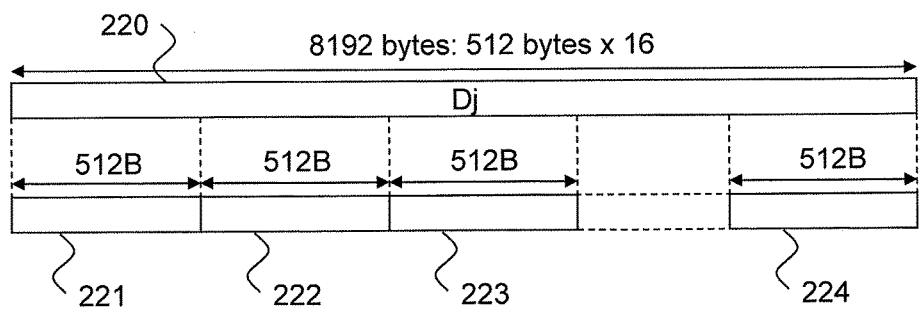
FIG. 2B is a view showing a sector part format (a plain text state) for a duplication allocation page.
Figure 2C:
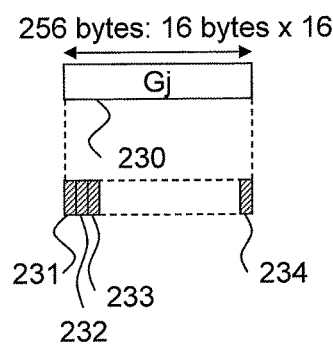
FIG. 2C is a view showing a code part format for a duplication allocation page.

In the next place, a data format that is applied to data that is written to the flash memory 105 with reference to FIGS. 2A, 2B, and 2C.

FIG. 2A is a view showing a data format of the plain text user data (user data in a plain text state) that is written to an isolated allocation page.

The user data (Di and Gi) 200 that includes a guarantee code includes a length of 8448 bytes in a plane text state, and includes sector data (201, 202, 203, ..., 204) of 16 pieces of 512 bytes. The guarantee codes (211, 212, 213, ..., 214) of 16 bytes are added to the sector data.

The FM controller 103 compresses the plain text user data of an isolated allocation page and writes the compressed user data (user data in a compressed state) to the flash memory 105. In the present embodiment, there are forming methods of two types for the user data of an isolated allocation page. For a first forming method, the user data of an isolated allocation page is user data itself. For a second forming method, the user data of an isolated allocation page is an exclusive OR of base data (8448 bytes) and difference data (8448 bytes). For a first forming method, the FM controller 103 compresses the user data itself and writes the user data to the flash memory 105. For a second forming method, the FM controller 103 compresses each of the base data and difference data and writes the data separately to the flash memory 105. Consequently, in the case where the FM controller 103 restores the user data that conforms to the second forming method, it is necessary that the FM controller 103 decompresses the base data and difference data that have been read from to the flash memory 105 by using the compression decompression circuit 104 to restore the base data and difference data to the original state and creates the exclusive OR data of the base data and difference data in a plain text state by using the XOR circuit 107.

FIG. 15A is a view showing the forming methods of two kinds. Here, the user data itself for the first forming method is called "base data" in some cases.

In the present embodiment, a writing amount of the flash memory 105 can be reduced by applying the second forming method to the user data of an isolated allocation page. The reason will be described in the following.

For example, a difference between pre-update user data and post-update user data is supposed to be only the 100-th bit (1 bit). In the previously existing technology, even if a difference is only 1 bit, it is necessary that pre-update user data is invalidated and post-update user data is compressed to be stored into the flash memory 105. However in accordance with the second forming method of the present embodiment, the base data is pre-update user data and the difference data is data in which the 100-th bit is 1 and remaining all bits are 0. By this configuration, pre-update user data remains as being valid data in the flash memory 105 and the compressed difference data is further written as the valid data. At this time, since the difference data is data that includes many patterns in which zero values are continued long, an amount of the difference data in a compressed state is extremely small. As a result, the total size of the compressed pre-update user data and the compressed difference data is smaller than a size of the compressed post-update user data.

In accordance with the present embodiment as described above, in the case where many points of the pre-update user data and the post-update user data conform to each other, a writing amount of the flash memory 105 can be reduced, thereby providing for a longer operating life of the flash memory 105.

FIG. 2B is a view showing a data format of a plain text sector part that is a sector part that is separated from the plain text user data of a duplication allocation page. A sector part Dj220 includes a length of 8192 bytes in a plane text state, and is configured by sector data (221, 222, 223, ..., 224) of 16 pieces of 512 bytes.

FIG. 2C is a view showing a data format of a plain text code part that is separated from the plain text user data of a duplication allocation page. A code part Gj230 includes a length of 256 bytes, and is configured by guarantee codes (231, 232, 233, ..., 234) of 16 pieces of 16 bytes.

As user data of a duplication allocation page, a sector part in which a plain text sector part that conforms to the format of FIG. 2B has been compressed and a plain text code part that conforms to the format of FIG. 2C are written to the flash memory 105. For the FM module 100, there are forming methods of two types for the sector part of a duplication allocation page. For the first forming method, the sector part of a duplication allocation page is a sector part itself that has been separated from the user data. For the second forming method, the sector part of a duplication allocation page is an exclusive OR of base data (8192 bytes) and difference data (8192 bytes). For the first forming method, the sector part itself is compressed and is written to the flash memory 105. For the second forming method, each of the base data and difference data is compressed and is written separately to the flash memory 105. Consequently, in the case where the FM controller 103 restores the sector part, the FM controller 103 decompresses the base data and difference data that have been read from to the flash memory 105 by using the compression decompression circuit 104 and creates the exclusive OR data of the base data and difference data in a plain text state by using the XOR circuit 107. In the case where a sector part of a duplication allocation page is a sector part that conforms to the first forming method for the FM module 100, a sector part itself is shared by a plurality of logical pages. In other words, a sector part in a physical page that has been allocated to a duplication allocation page is shared by a plurality of logical pages (duplication allocation pages). On the other hand, in the case where a sector part of a duplication allocation page is a sector part that conforms to the second forming method, the base data is shared by a plurality of logical pages (duplication allocation pages) and the difference data is individually managed for every duplication allocation page. The code part of a duplication allocation page is individually managed for every duplication allocation page in any case of the forming methods. FIG. 15B is, for example, a conceptual drawing showing the state in which the user data A and D to which the first forming method is applied and the user data B and C to which the second forming method is applied share the base data. Here, the sector part itself for the first forming method is also called the base data.

In the present embodiment, a writing amount of the flash memory 105 can be reduced since the second forming method in addition to the first forming method is applied to a sector part of a duplication allocation page. The reason will be described in the following.

For example in FIG. 15B, a difference between a sector part of the user data A and a sector part of the user data B is supposed to be only the 100-th bit (1 bit). In the case where the previously existing technology (includes Patent Literature 1) is applied, the both sector parts are determined as different data, are not manager as a duplication allocation page, and are separately compressed to be stored into the flash memory 105. In accordance with the present embodiment, since the second forming method is applied to a sector part of the user data B, a sector part of the user data A becomes the base data, in which the 100-th bit is 1 and remaining all bits are difference data B. By this configuration, the base data (sector part) that has been compressed and the difference data B that has been compressed are written to the flash memory 105. At this time, since the difference data B is data that includes many patterns in which zero values are continued long, the size is extremely small. As a result, a writing amount is smaller as compared with the case in which a sector part of the user data A and a sector part of the user data B are separately compressed to be stored into the flash memory 105.

In accordance with the present embodiment as described above, not only in the case where the sector parts of a plurality of logical pages completely conform to each other but also in the case where many points of the sector parts of a plurality of logical pages conform to each other, a writing amount of the flash memory 105 can be reduced by applying the deduplication processing, thereby providing for a longer operating life of the flash memory 105.

Figure 3:
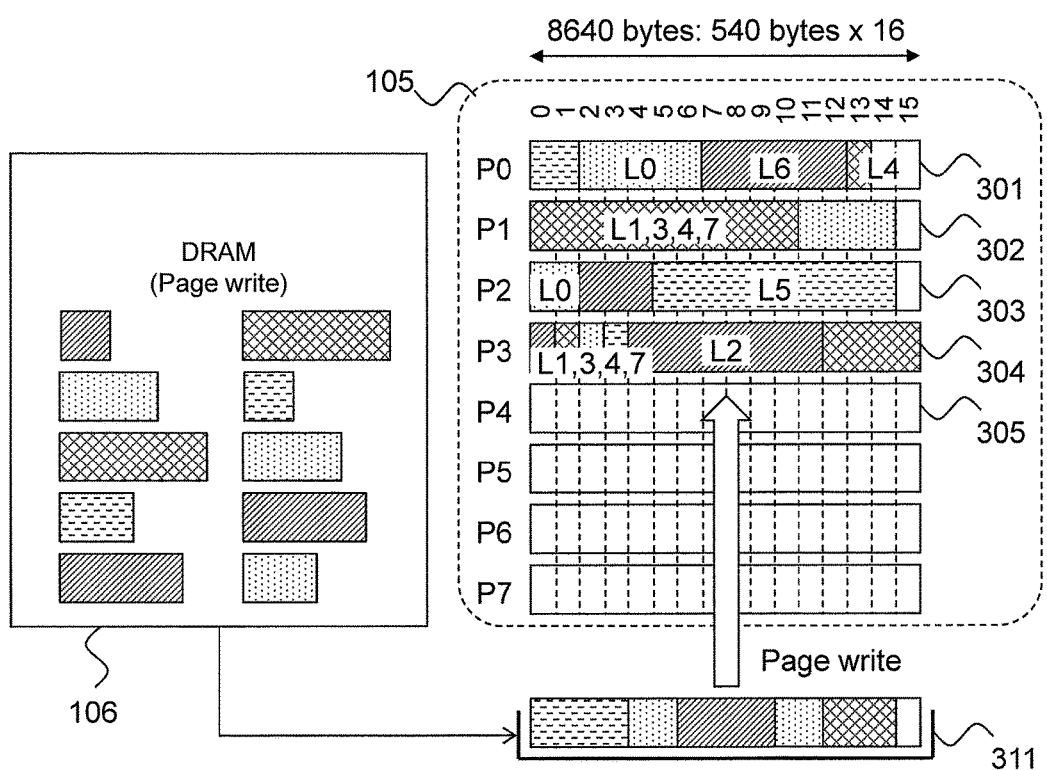
FIG. 3 is a view showing an example of a data writing method and a data stored state to a flash memory.

A data writing method to the flash memory 105 will be described with reference to FIG. 3 in the next place. In FIG. 3, a filled region (a pattern) means data (user data, a sector part, or a code part) and a white painted region means dummy data (null data).

As described before, the FM controller 103 compresses the base data and the difference data that conforms to the data format shown in FIG. 2A or FIG. 2B by using the compression decompression circuit 104 and writes the data to the flash memory 105 in order to reduce a writing amount of the flash memory 105. A size of the compressed data varies depending on the original plane text data (a configuration of plane text data). A size of data that includes many patterns in which the same value is continued is decreased by the compression. However, a size of data that includes many random patterns is increased by the compression in some cases. The compressed data and a code part that conforms to the data format shown in FIG. 2C are stored by a write buffer on the DRAM 106 on a temporary basis until being written to the flash memory 105 as shown on the left side of FIG. 3. Since the flash memory 10 includes a feature of being written only in a page unit, the FM controller 103 links the compressed data in a write buffer, creates data of the maximum size that does not exceed the page size 311 (in the case where the total sum of linked data is less than the page size 311, creates data of the page size 311 by linking dummy data to the linked data), and writes the created data to an unused page 3 (for example, a physical page P4) of the flash memory 105. Writing data in a page unit is called "page write" in some cases. The parity based on an error correcting code (not shown) is added to data of a page write. In order to provide for a write destination area of the parity, a size (8640 bytes) of a physical page of the flash memory 105 is larger than a size (8448 bytes) of one logical page.

The left side of FIG. 3 shows an example of a state in which the compressed data and a code part have been stored in physical pages P0 to P3 (301, 302, 303, and 304) of the flash memory 105. The physical page P0 has stored the base data of each of the isolated allocation pages L0 and L6 and the difference data of the duplication allocation page L4. The physical page P1 has stored the base data that is shared by the duplication allocation pages L1, L3, L4, and L7. The physical page P2 has stored the difference data of the isolated allocation page L0 and the base data of the isolated allocation page L5. The physical page P3 has stored a code part of each of the duplication allocation pages L1, L3, L4, and L7 and the base data of the isolated allocation page L2.

In the next place with reference to FIGS. 4A and 4B, the following describes an address conversion table and a duplication count table that are formed on the DRAM 106 in order to manage a condition in which the user data is stored in the flash memory 105 by using the FM controller 103.

An address conversion table 400 that is shown in FIG. 4A holds the information that includes a logical page address 410, a base data stored destination 420, a difference flag 430, a difference data stored destination 440, a duplication flag 450, and a code part address 460 for every logical page.

The logical page address 410 is a logical address of a leading head of a logical page.

The base data stored destination 420 is the information that includes a physical address Pi [Ni] (a page address Pi and a sector number Ni) that stores the base data and a stored sector size.

The difference flag 430 indicates the existence or non-existence of a difference. In the case where a logical page is an isolated allocation page or a duplication allocation page to which the first forming method is applied, the difference flag 430 is "OFF" (that means the non-existence of a difference). In the case where a logical page is an isolated allocation page or a duplication allocation page to which the second forming method is applied, the difference flag 430 is "ON" (that means the existence of a difference).

The difference data stored destination 440 is the information that is effective in the case where the difference flag 430 is "ON" and is the information that includes a physical address Pi [Ni] (a page address Pi and a sector number Ni) that stores the difference data and a stored sector size.

The duplication flag 450 indicates whether or not a logical page is a logical page to which a deduplication technique is applied. In the case where a logical page is an isolated allocation page, the duplication flag 450 is "OFF" (that means that a deduplication technique is not applied). In the case where a logical page is a duplication allocation page, the duplication flag 450 is "ON" (that means that a deduplication technique is applied).

The code part address 460 is the information that is effective in the case where the duplication flag 450 is "ON" and is the information that includes a physical address Pi [Ni] (a page address Pi and a sector number Ni) that stores a code part of the user data. A size of a code part is 256 bytes and a stored sector size is fixed at 1. Consequently, the code part address 460 may not include a stored sector size.

An address conversion table 400 that is shown in FIG. 4A holds the information that conforms to the stored state that is shown on the right side of FIG. 3 (for example, the information of the logical pages L0 to L7). The logical page L0 is a isolated allocation page to which the second forming method is applied. The logical pages L1, L3, and L7 are a duplication allocation page to which the first forming method is applied. The logical pages L2, L5, and L6 are an isolated allocation page to which the first forming method is applied. The logical page L4 is a duplication allocation page to which the second forming method is applied.

A duplication count table that is shown in FIG. 4B holds the information that includes a base data address 480 and a shared count 490 for every base data that is shared by a plurality of duplication allocation pages.

The base data address 480 is the information that includes a physical address Pi [Ni] (a page address Pi and a sector number Ni) that stores the base data.

The shared count 490 indicates the number of logical pages (duplication allocation pages) that shares the base data.

The duplication count table that is shown in FIG. 4B indicates the stored state that is shown on the right side of FIG. 3 as a specific example, that is, that four logical pages L1, L3, L4, and L7 share the base data that is stored from a sector number 0 of a physical page P1.

Figure 5:
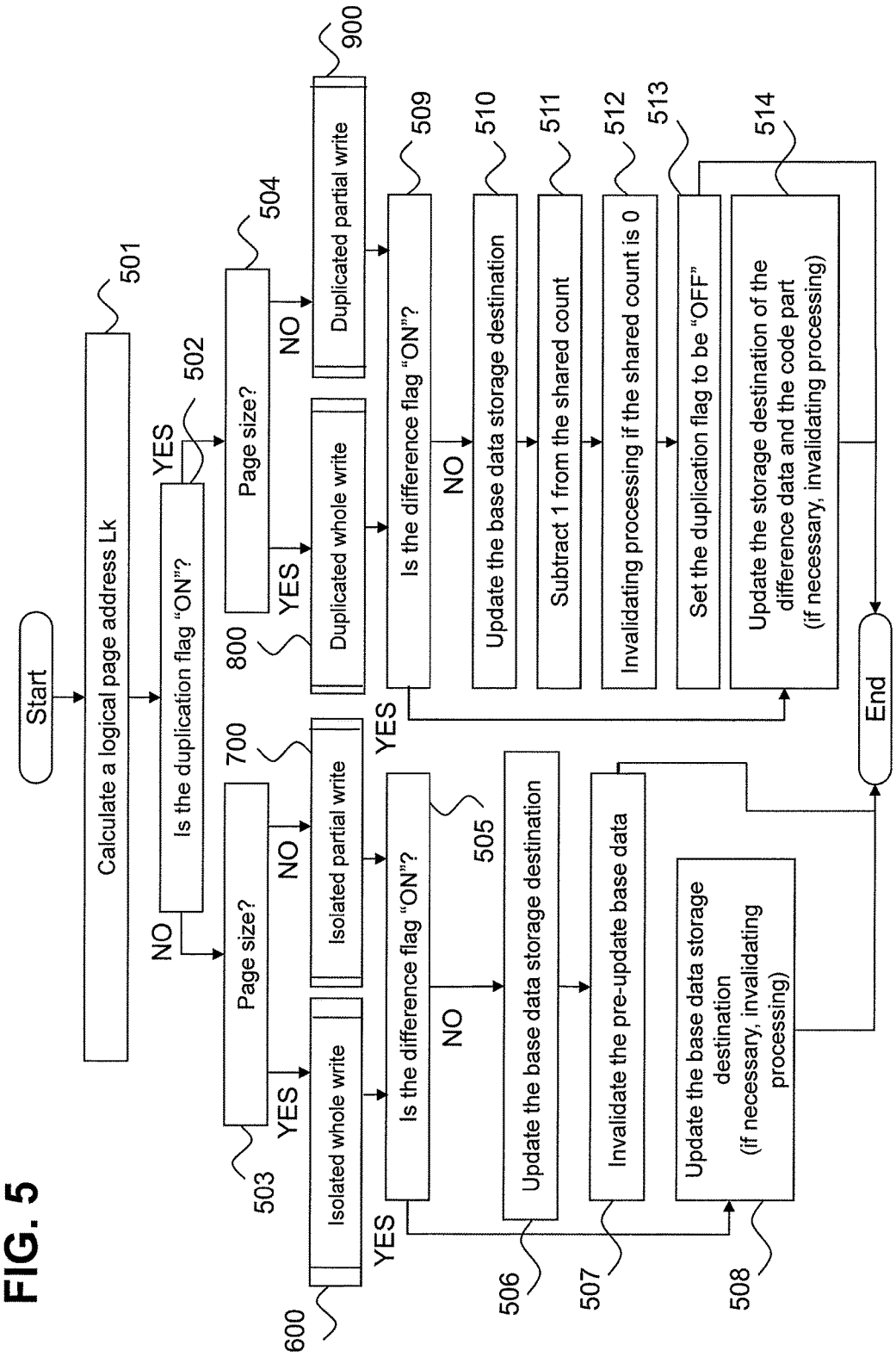
FIG. 5 is a flowchart of a write command processing.

In the next place with reference to FIG. 5, the following describes the processing in the case where the FM module 100 updates the user data in accordance with a write command from a higher-level apparatus (the storage controller 1401). The FM controller 103 of the FM module 100 selects the most appropriate one of the forming methods of the user data of an update target by this processing in order to reduce a writing amount of the flash memory 105.

In the first place, the FM controller 103 calculates a logical page address Lk to which a logical address Wa that has been specified by a write command belongs (step 501). The FM controller 103 determines whether a deduplication flag 450 that is corresponded to the logical page address Lk that has been calculated is "OFF" or "ON" (step 502). In the case where the deduplication flag 450 is "OFF" (an isolated allocation page), the processing is transited to the step 503. In the case where the deduplication flag 450 is "ON" (a duplication allocation page), the processing is transited to the step 504.

In the step 503, the FM controller 103 determines whether the number of sectors of the write data that conforms to the write command is a page size (16 sectors) or a size smaller than the page size. In the case where the number of sectors is a page size, the FM controller 103 executes the whole write processing of an isolated allocation page of the step 600. Otherwise, the FM controller 103 executes the partial write processing of an isolated allocation page of the step 700.

In the step 504, the FM controller 103 determines whether the number of sectors of the write data that is written by the write command is a page size (16 sectors) or a size smaller than the page size. In the case where the number of sectors is a page size, the FM controller 103 executes the whole write processing of a duplication allocation page of the step 800. Otherwise, the FM controller 103 executes the partial write processing of a duplication allocation page of the step 900.

The whole write processing of an isolated allocation page of the step 600, the partial write processing of an isolated allocation page of the step 700, the whole write processing of a duplication allocation page of the step 800, and the partial write processing of a duplication allocation page of the step 900 will be described in detail in the following with reference to FIGS. 10 to 13.

Figure 10:
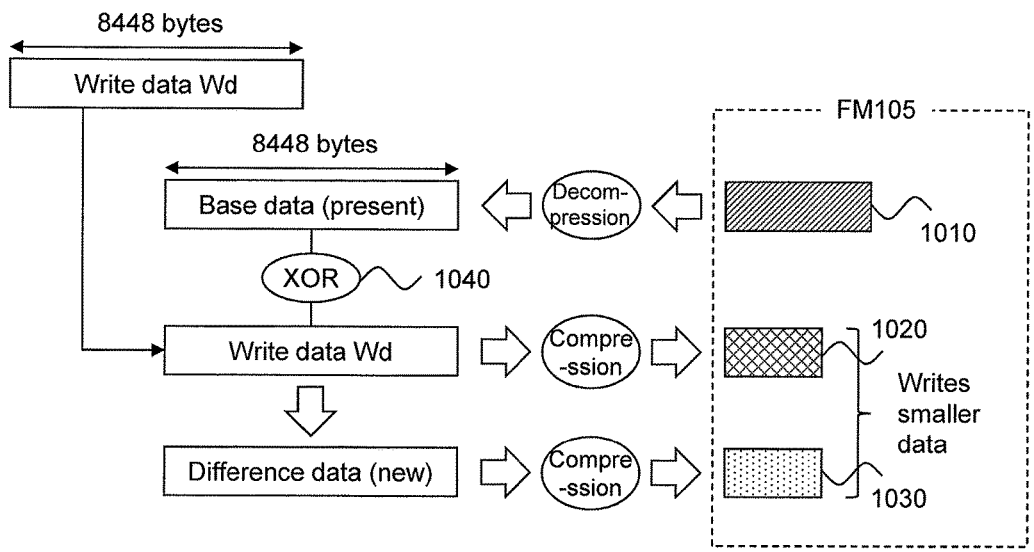
FIG. 10 is a conceptual drawing of a whole write processing to an isolated allocation page.

FIG. 10 is a view showing a whole write processing to an isolated allocation page.

For this processing, in the case where the user data of the logical page Lk is updated to the write data Wd, a new forming method of the user data is selected in the processing. That is to say, a step to be selected is that a first forming method is selected and the write data Wd is written as new base data or that a second forming method is selected and the difference data from the write data Wd is written without modifying the present base data.

The data 1010 is a compressed data of the present base data and has been stored in the flash memory 105. In the case where the difference data of the second forming method is created, it is necessary to read the compressed data to be decompressed and to calculate an exclusive OR with the write data Wd (1040).

The data 1020 is a compressed data of the new base data for the first forming method, and the data 1030 is a compressed data of the difference data for the second forming method. The FM controller 103 selects data in which a write size to the flash memory 105 is smaller. In the case where the data 1020 is smaller, the FM controller 103 writes the data 1020 and selects the first forming method. In the case where the data 1030 is smaller, the FM controller 103 writes the data 1030 and selects the second forming method. In the case where the data 1030 and the data 1020 includes the same size, the FM controller 103 writes the data 1020 and selects the first forming method. This is because for the second forming method, it is necessary to read data of two types of base data and difference data when the user data is read, thereby deteriorating a reading performance.

In this processing, in the case where the write data Wd is similar to the present base data in a pattern, the difference data includes many continuous zero values and can be compressed to be smaller, whereby a selection of the second forming method is effective.

In the case where the FM controller 103 receives a read command in which the write data Wd that has been written by the method described with reference to FIG. 10 is a read target from a higher-level apparatus (the storage controller 1401), the FM controller 103 can restore the write data Wd based on the address conversion table 400 and transmit the write data Wd as the read data to the higher-level apparatus. The write data Wd that has been restored is (1) data that has been created by decompressing the data 1020 or (2) an exclusive OR of the difference data (new) that has been obtained by decompressing the data 1030 and the base data that has been obtained by decompressing the data 1010.

Figure 11:
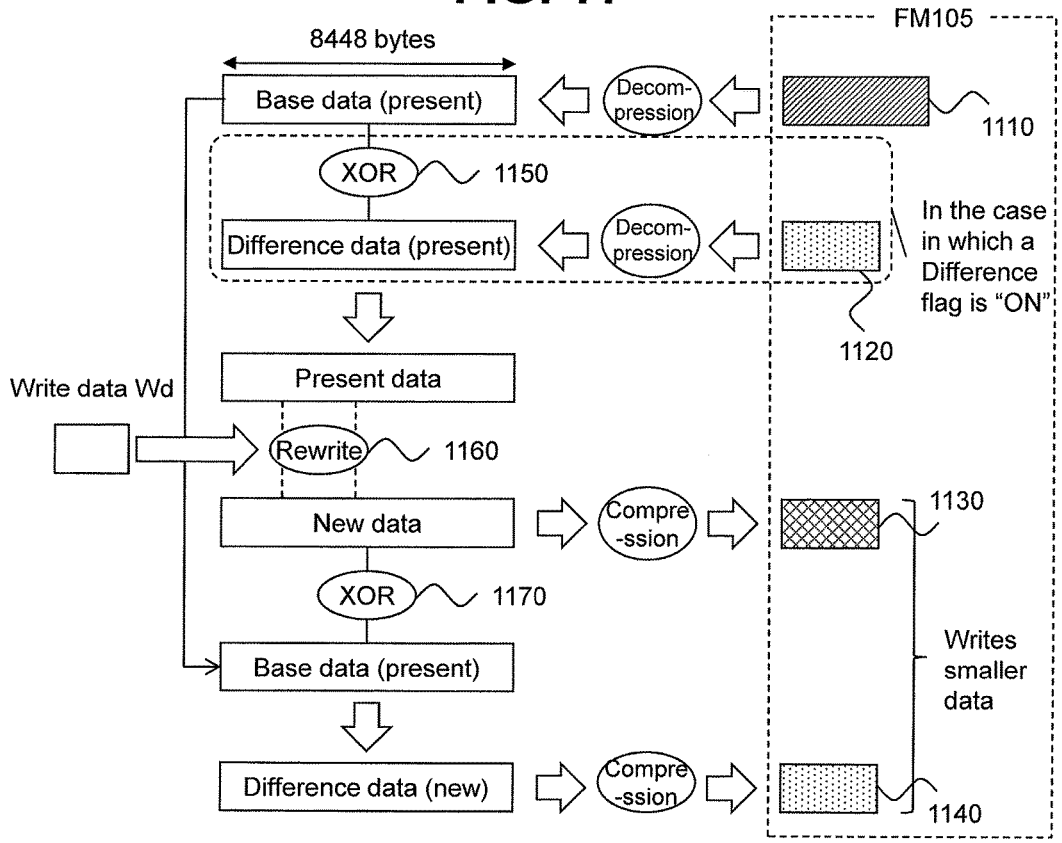
FIG. 11 is a conceptual drawing of a partial write processing to an isolated allocation page.

FIG. 11 is a view showing a partial write processing to an isolated allocation page.

For this processing, in the case where a part of the user data of the logical page Lk is rewritten by the write data Wd, a new forming method of the user data after rewriting is selected in the processing. That is to say, a step to be selected is that a first forming method is selected and the user data after rewriting is written as new base data or that a second forming method is selected and the difference data from the user data after rewriting is written without modifying the present base data.

The data 1110 is a compressed data of the present base data, the data 1120 is a compressed data of the present difference data, and the both of data have been stored in the flash memory 105. In the case where the difference data of the second forming method is created, it is necessary to carry out the following processing. The FM controller 103 reads and decompresses the data 1110 and the data 1120, and calculates an exclusive OR of the both of data (1150) to create the present user data. In the next place, the FM controller 103 rewrites a part of the present user data by the write data Wd to create new user data (1160), and calculates an exclusive OR of the new user data and the present base data (1170) to create new difference data.

The data 1130 is a compressed data of the new base data for the first forming method, and the data 1140 is a compressed data of the difference data for the second forming method. The FM controller 103 selects data in which a write size to the flash memory 105 is smaller. In the case where the data 1130 is smaller, the FM controller 103 writes the data 1130 and selects the first forming method. In the case where the data 1140 is smaller, the FM controller 103 writes the data 1140 and selects the second forming method. In the case where the data 1130 and the data 1140 includes the same size, the FM controller 103 writes the data 1130 and selects the first forming method. This is because for the second forming method, it is necessary to read data of two types of base data and difference data when the user data is read, thereby deteriorating a reading performance.

In this processing, in the case where a size of the write data Wd is similar (a rewriting amount is smaller), the new difference data includes many continuous zero values and can be compressed to be smaller, whereby a selection of the second forming method is effective.

In the case where the FM controller 103 receives a read command in which the write data Wd that has been written by the method described with reference to FIG. 11 is a read target from a higher-level apparatus, the FM controller 103 can restore the write data Wd based on the address conversion table 400 and transmit the write data Wd as the read data to the higher-level apparatus. The write data Wd that has been restored is (1) partial data that has been extracted from data that has been created by decompressing the data 1130 or (2) partial data that has been extracted from an exclusive OR of the difference data (new) that has been obtained by decompressing the data 1140 and the base data that has been obtained by decompressing the data 1110.

Figure 12:
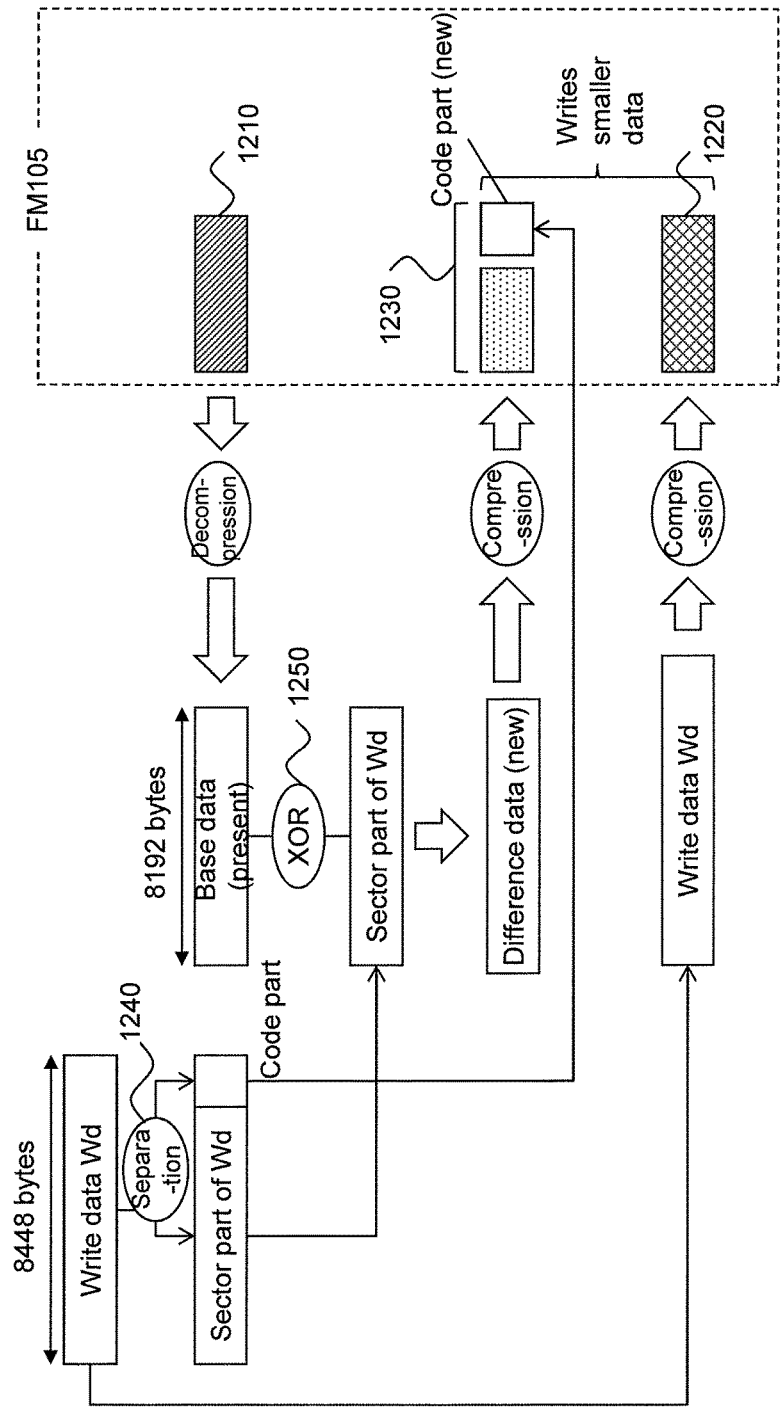
FIG. 12 is a conceptual drawing of a whole write processing to a duplication allocation page.

FIG. 12 is a view showing a whole write processing to a duplication allocation page.

For this processing, in the case where the user data of the logical page Lk is updated to the write data Wd, a new page type of the logical page Lk and a new forming method of the user data is selected in the processing. That is to say, a step to be selected is that a first forming method of an isolated allocation page is selected and the write data Wd is written as new base data or that a second forming method of a duplication allocation page is selected and the difference data (the difference data from the write data Wd) and a code part are written without modifying the present base data.

The data 1210 is a compressed data of the present base data and has been stored in the flash memory 105. In the case where the difference data of the second forming method of a duplication allocation page is created, it is necessary to read the data 1210 to be decompressed and to calculate an exclusive OR with a sector part that has been separated from the write data Wd (1250).

The data 1220 is a compressed data of the new base data for the first forming method of an isolated allocation page, and the data 1230 is data in which a compressed data of the difference data for the second forming method of a duplication allocation page and a code part that has been separated from the write data Wd (1250) are linked to each other. The FM controller 103 selects data in which a write size to the flash memory 105 is smaller. In the case where the data 1220 is smaller, the FM controller 103 writes the data 1220 and selects the first forming method of an isolated allocation page. In the case where the data 1230 is smaller, the FM controller 103 writes the data 1230 and selects the second forming method of a duplication allocation page. In the case where the data 1230 and the data 1220 includes the same size, the FM controller 103 writes the data 1220 and selects the first forming method of an isolated allocation page. This is because for the second forming method of a duplication allocation page, it is necessary to read the base data, the difference data, and the code part when the user data is read, thereby deteriorating a reading performance.

In this processing, in the case where the sector part of the write data Wd is similar to the present base data in a data pattern, the difference data includes many continuous zero values and can be compressed to be smaller, whereby a selection of the second forming method of a duplication allocation page is effective.

In the case where the FM controller 103 receives a read command in which the write data Wd that has been written by the method described with reference to FIG. 12 is a read target from a higher-level apparatus, the FM controller 103 can restore the write data Wd based on the address conversion table 400 and transmit the write data Wd as the read data to the higher-level apparatus. The write data Wd that has been restored is (1) data that has been created by decompressing the data 1220 or (2) data that is configured by an exclusive OR of the difference data (new) that has been obtained by decompressing the difference data for the data 1230 and the base data that has been obtained by decompressing the data 1210 and the code part (new) for the data 1230.

Figure 13:
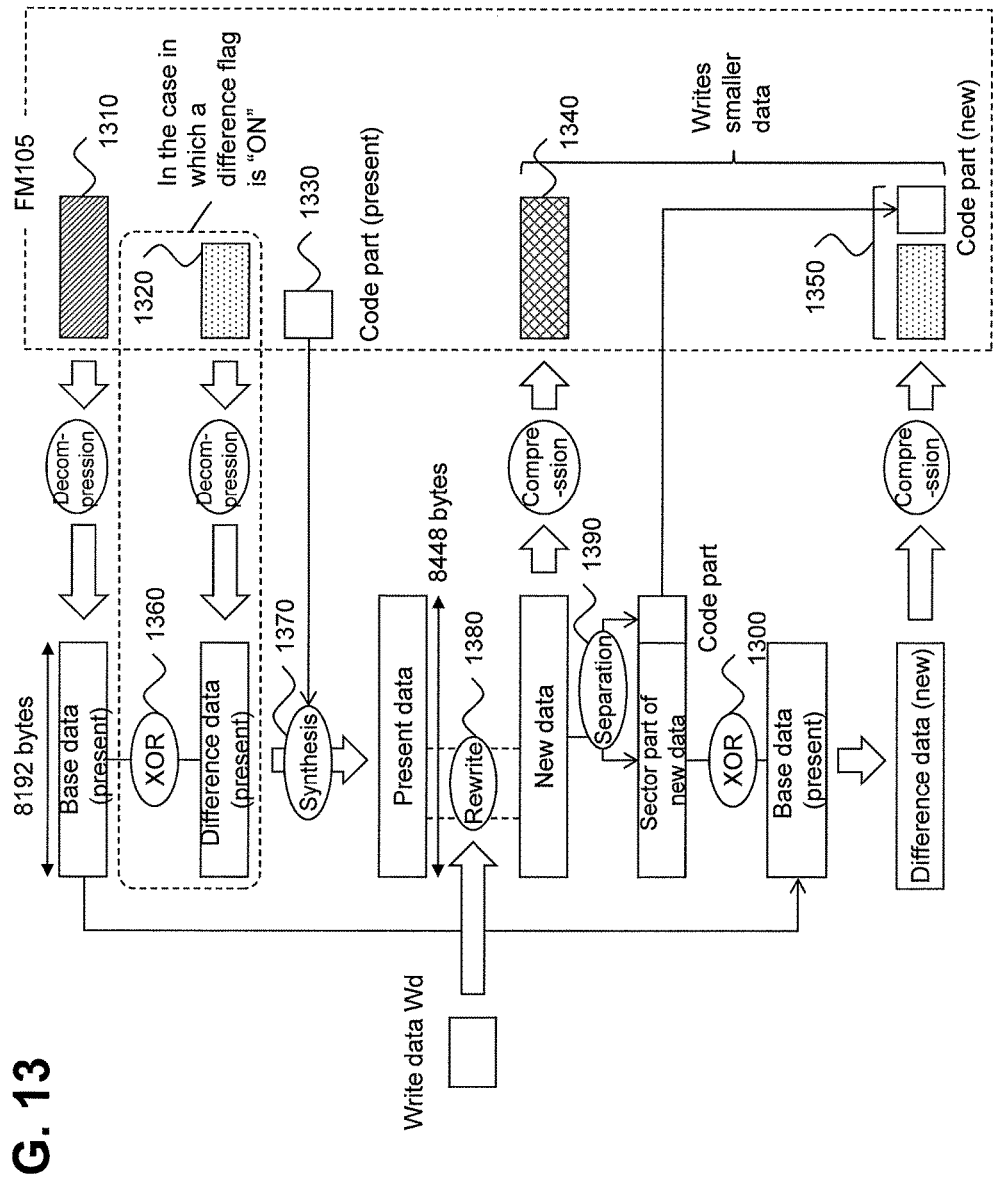
FIG. 13 is a conceptual drawing of a partial write processing to a duplication allocation page.

FIG. 13 is a view showing a partial write processing to a duplication allocation page.

For this processing, in the case where a part of the user data of the logical page Lk is rewritten by the write data Wd, a new page type of the logical page Lk and a new forming method of the user data after rewriting is selected in the processing. That is to say, a step to be selected is that a first forming method of an isolated allocation page is selected and the user data after rewriting is written as new base data or that a second forming method of a duplication allocation page is selected and the difference data (the difference data from the user data after rewriting) is written without modifying the present base data.

The data 1310 is a compressed data of the present base data, the data 1320 is a compressed data of the difference data of the present difference data, the data 1330 is a present code part, and all of the data have been stored in the flash memory 105. In the case where the difference data of the second forming method of a duplication allocation page is created, it is necessary to carry out the following processing. The FM controller 103 reads and decompresses the present data and the difference data, calculates an exclusive OR of the present data and the difference data (1360), and synthesizes a code part that has been read to the exclusive OR data that has been created by the calculation (1360) to create the present user data. In the next place, the FM controller 103 rewrites a part of the present user data by the write data Wd to create new user data (1380), and calculates an exclusive OR of a sector part that has been separated from the new user data (1390) and the present base data (1300) to create new difference data.

The data 1340 is a compressed data of the new base data for the first forming method of an isolated allocation page, and the data 1350 is data in which a compressed data of the difference data for the second forming method of a duplication allocation page and a code part that has been separated from the new user data are linked to each other. The FM controller 103 selects data in which a write size to the flash memory 105 is smaller. In the case where the data 1340 is smaller, the FM controller 103 writes the data 1340 and selects the first forming method of an isolated allocation page. In the case where the data 1350 is smaller, the FM controller 103 writes the data 1350 and selects the second forming method of a duplication allocation page. In the case where the data 1340 and the data 1350 includes the same size, the FM controller 103 writes the data 1340 and selects the first forming method of an isolated allocation page. This is because for the second forming method of a duplication allocation page, it is necessary to read the base data, the difference data, and the code part when the user data is read, thereby deteriorating a reading performance.

In this processing, in the case where a size of the write data Wd is similar (a rewriting amount is smaller), the new difference data includes many continuous zero values and can be compressed to be smaller, whereby a selection of the second forming method of a duplication allocation page is effective.

In the case where the FM controller 103 receives a read command in which the write data Wd that has been written by the method described with reference to FIG. 13 is a read target from a higher-level apparatus, the FM controller 103 can restore the write data Wd based on the address conversion table 400 and transmit the write data Wd as the read data to the higher-level apparatus. The write data Wd that has been restored is (1) partial data that has been extracted from data that has been created by decompressing the data 1340 or (2) partial data that has been extracted from data that is configured by an exclusive OR of the difference data (new) that has been obtained by decompressing the compressed difference data for the data 1350 and the base data that has been obtained by decompressing the data 1310 and the code part (new) for the data 1350.

Figure 6:
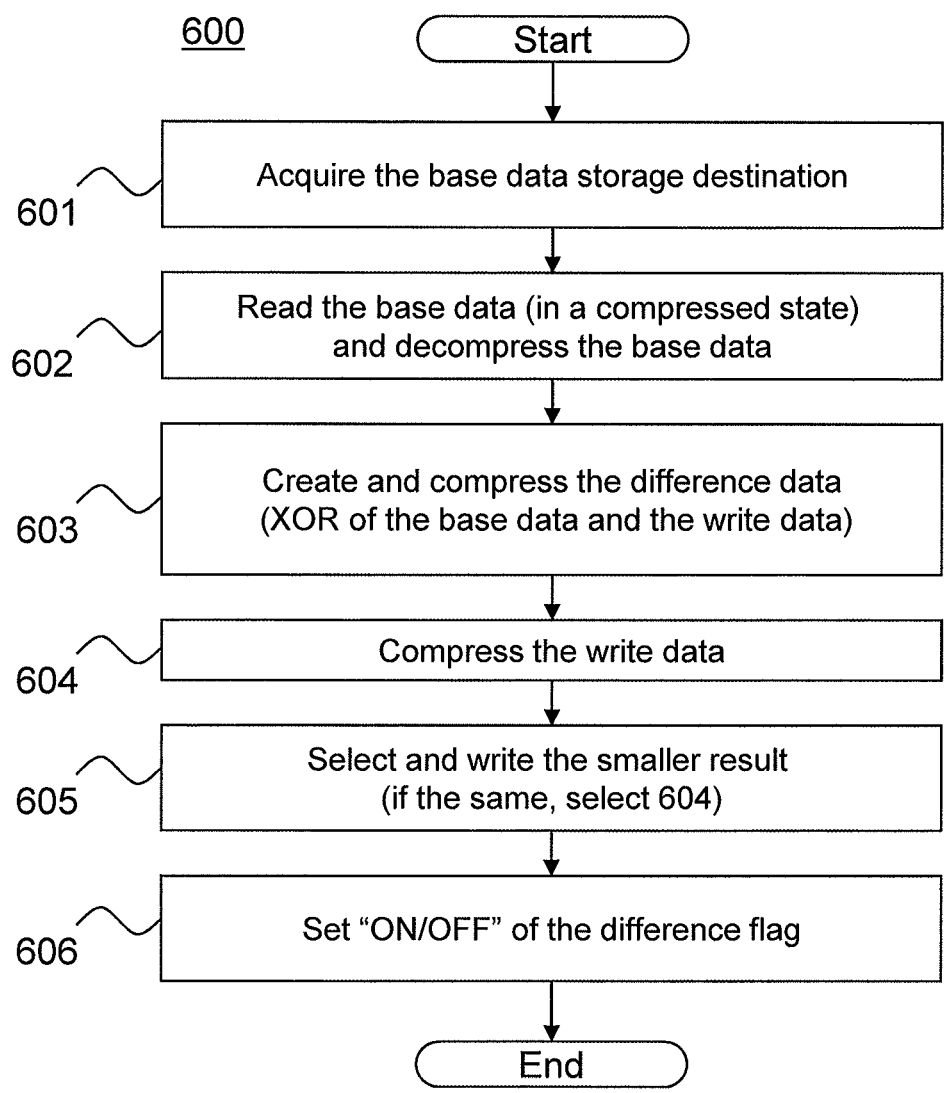
FIG. 6 is a flowchart of a whole write processing to an isolated allocation page.

The whole write processing of an isolated allocation page of the step 600 will be described with reference to FIG. 6. In order to avoid the redundancy of the descriptions in the following, the compression/decompression that is executed by the compression decompression circuit 104 of the FM controller 103 is described as the compression/decompression of the FM controller 103, and a calculation of an exclusive OR that is executed by the XOR circuit 107 of the FM controller 103 is described as a calculation of the FM controller 103. Moreover, a logical page to which the logical page address Lk that has been calculated in the step 501 belongs is referred to as a "logical page Lk".

In the first place, the FM controller 103 acquires the base data stored destination 420 (a physical address Px [Nx] and a stored sector size Sx) that is corresponded to the logical page address Lk that has been calculated in the step 501 (step 601). The FM controller 103 reads the compressed base data (the base data that has been compressed) of the logical page Lk from a physical area that is indicated by the base data stored destination 420, and restores the base data (in a plane text state) by decompressing the compressed base data (step 602).

In the next place, the FM controller 103 calculates an exclusive OR of the base data of the logical page Lk (the base data that has been restored in the step 602) and the write data Wd to create the difference data of the logical page Lk, and compresses the difference data to create the compressed base data (step 603).

On the other hand, the FM controller 103 compresses the write data Wd to create the compressed write data (step 604).

The FM controller 103 compares a size of the result data (the compressed difference data) of the step 603 and a size of the result data (the compressed write data) of the step 604, and selects smaller data to be written to the flash memory 105 (step 605). In the case where the sizes are equivalent to each other, the result data of the step 604 is selected.

In the case where the result data of the step 603 is selected, since the second forming method is applied to the user data of the logical page Lk, the FM controller 103 sets the difference flag 430 that is corresponded to the logical page Lk to be "ON". In the case where the result data of the step 604 is selected, since the first forming method is applied to the user data of the logical page Lk, the FM controller 103 sets the difference flag 430 that is corresponded to the logical page Lk to be "OFF" (step 606).

With that, the whole write processing of an isolated allocation page is terminated, and the processing is transited to the step 505 of FIG. 5.

Figure 7:
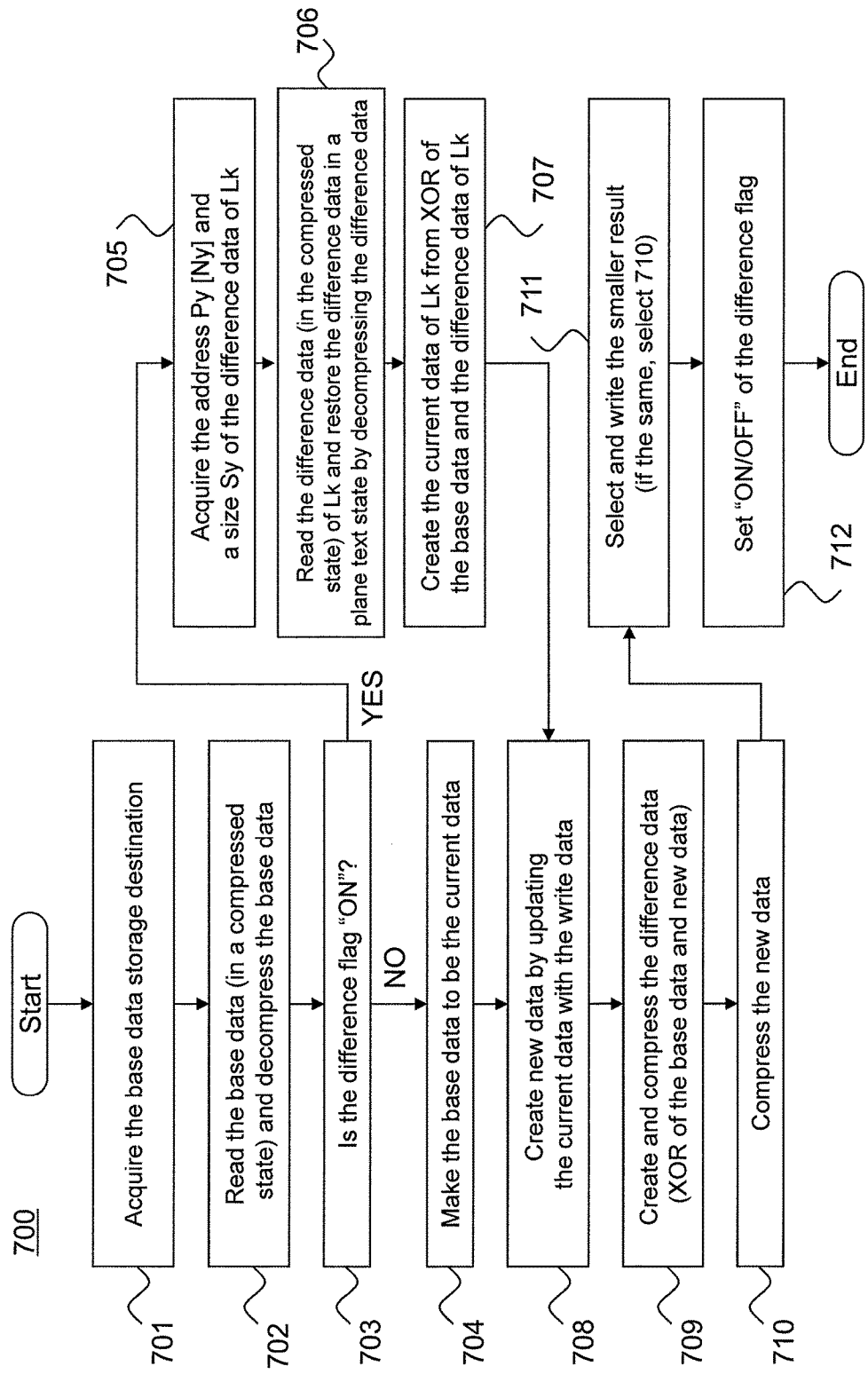
FIG. 7 is a flowchart of a partial write processing to an isolated allocation page.

The flow of the whole write processing of an isolated allocation page of the step 700 will be described with reference to FIG. 7.

In the first place, the FM controller 103 acquires the base data stored destination 420 (a physical address Px [Nx] and a stored sector size Sx) that is corresponded to the logical page address Lk that has been calculated in the step 501 (step 701). The FM controller 103 reads the compressed base data of the logical page Lk from a physical area that is indicated by the base data stored destination 420, and restores the base data (in a plane text state) by decompressing the compressed base data (step 702).

In the next place, the FM controller 103 checks the difference flag 430 that is corresponded to the logical page Lk in the step 703. In the case where the difference flag is "OFF", the processing is transited to the step 704. On the other hand, in the case where the difference flag is "ON", the processing is transited to the step 705.

In the step 704, since there is no difference data, the FM controller 103 makes the result data of the step 702 (the base data that has been restored) to be the current user data of the logical page Lk, and the processing is transited to the step 708.

On the other hand in the step 705, in order to obtain the current user data, the FM controller 103 acquires the difference data stored destination 440 (a physical address Py [Ny] and a stored sector size Sy) that is corresponded to the logical page address Lk. The FM controller 103 reads the compressed difference data (the difference data that that has been compressed) of the logical page Lk from a physical area that is indicated by the difference data stored destination 440, and restores the difference data (in a plane text state) by decompressing the compressed difference data (step 706). The FM controller 10 then calculates an exclusive OR of the base data and the difference data of the logical page Lk and creates the current user data of the logical page Lk (step 707). After that, the processing is transited to the step 708.

In the step 708, the FM controller 103 rewrites a part of the address Wa that has been specified by the write command with the write data Wd for the current user data of the logical page Lk, and creates the new user data of the logical page Lk.

In the next place, the FM controller 10 then calculates an exclusive OR of the current base data of the logical page Lk and new user data and creates the new difference data of the logical page Lk. The FM controller 103 then compresses the new difference data and creates the compressed difference data (step 709).

On the other hand, the FM controller 103 compresses the new user data of the logical page Lk and creates the compressed user data (step 710).

The FM controller 103 compares a size of the result data (the compressed difference data) of the step 709 and a size of the result data (the compressed user data) of the step 710 and selects the result data of smaller size to be written to the flash memory 105 (step 711). In the case where the sizes are equivalent to each other, the result data of the step 710 is selected.

In the case where the result data of the step 709 is selected, since the second forming method is applied to the user data of the logical page Lk, the FM controller 103 sets the difference flag 430 that is corresponded to the logical page address Lk to be "ON". In the case where the result data of the step 710 is selected, since the first forming method is applied to the user data of the logical page Lk, the FM controller 103 sets the difference flag 430 that is corresponded to the logical page address Lk to be "OFF" (step 712).

With that, the whole write processing of an isolated allocation page is terminated, and the processing is transited to the step 505 of FIG. 5.

Figure 8:
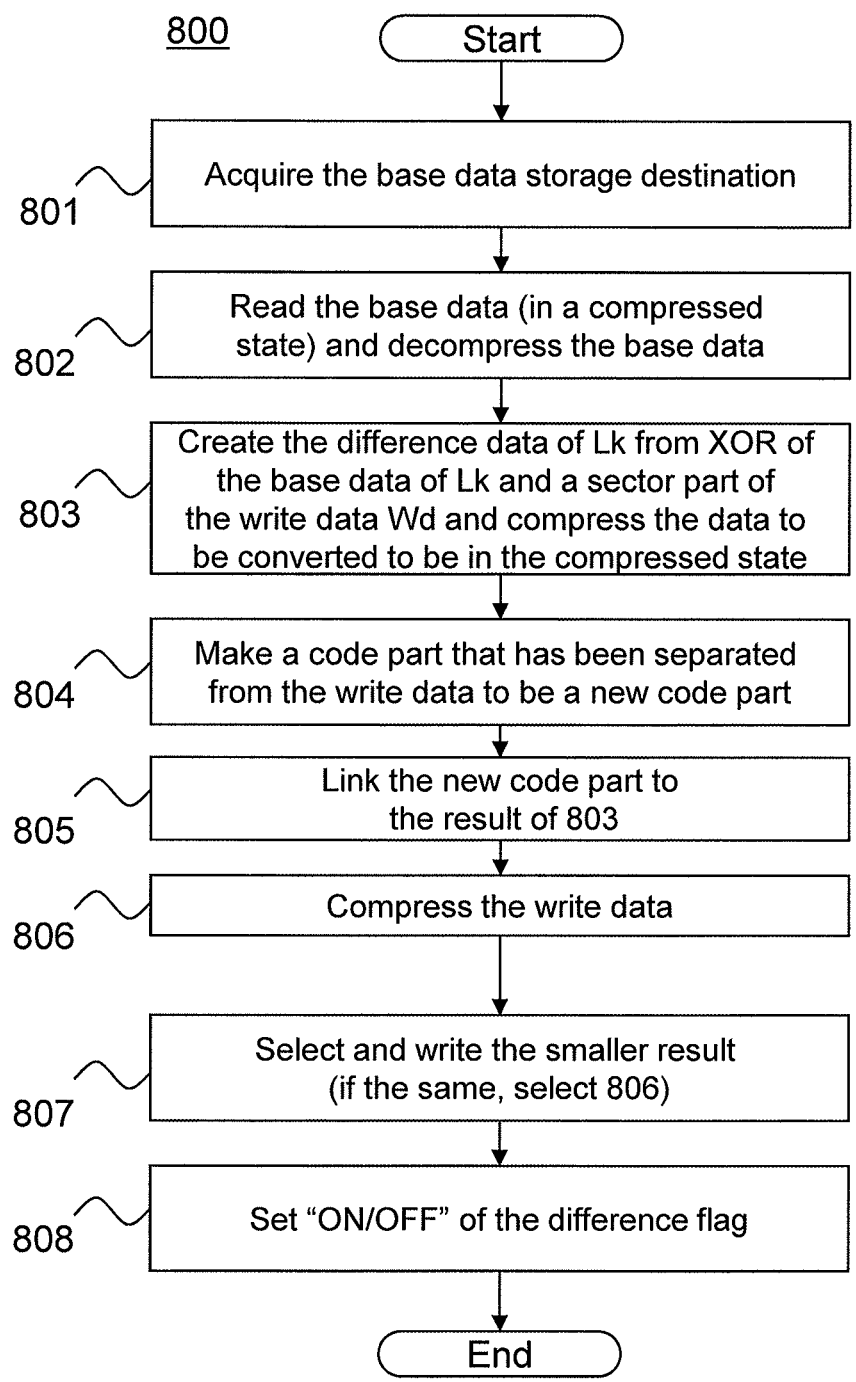
FIG. 8 is a flowchart of a whole write processing to a duplication allocation page.

The flow of the whole write processing of a duplication allocation page of the step 800 will be described with reference to FIG. 8.

In the first place, the FM controller 103 acquires the base data stored destination 420 (a physical address Px [Nx] and a stored sector size Sx) that is corresponded to the logical page address Lk that has been calculated in the step 501 (step 801). The FM controller 103 reads the compressed base data of the logical page Lk from a physical area that is indicated by the base data stored destination 420, and restores the base data (in a plane text state) by decompressing the compressed base data (step 802).

In the next place, the FM controller 10 then calculates an exclusive OR of the base data of the logical page Lk and a sector part that has been separated from the write data Wd and creates the difference data of the logical page Lk. The FM controller 103 then compresses the difference data and creates the compressed difference data (step 803). Moreover, the FM controller 103 makes a code part that has been separated from the write data Wd to be a new code part of the logical page Lk (step 804) and links the code part to the result data (the compressed difference data) of the step 803 (step 805).

On the other hand, the FM controller 103 compresses the write data Wd and creates the compressed write data (step 806).

The FM controller 103 compares a size of the result data (the compressed difference data+a new code part) of the step 805 and a size of the result data (the compressed write data) of the step 806 and selects the result data of smaller size to be written to the flash memory 105 (step 807). In the case where the sizes are equivalent to each other, the result data of the step 806 is selected.

In the case where the result data of the step 805 is selected, since the second forming method is applied to the user data the logical page Lk, the FM controller 103 sets the difference flag 430 that is corresponded to the logical page address Lk to be "ON". In the case where the result data of the step 806 is selected, since the first forming method is applied to the user data the logical page Lk, the FM controller 103 sets the difference flag 430 that is corresponded to the logical page address Lk to be "OFF" (step 808).

With that, the whole write processing of a duplication allocation page is terminated, and the processing is transited to the step 509 of FIG. 5.

Figure 9:
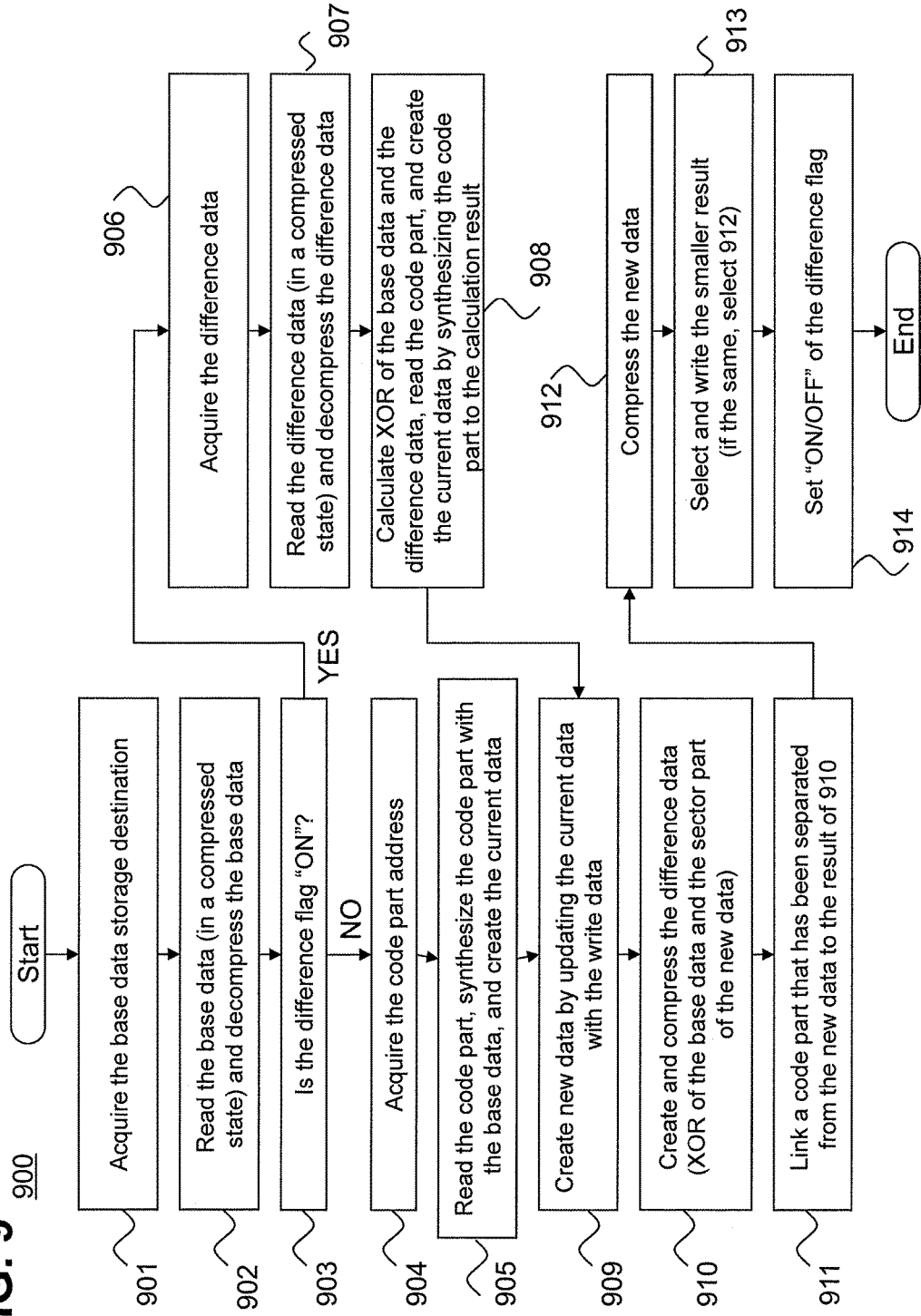
FIG. 9 is a flowchart of a partial write processing to a duplication allocation page.

The flow of the partial write processing of a duplication allocation page of the step 900 will be described with reference to FIG. 9.

In the first place, the FM controller 103 acquires the base data stored destination 420 (a physical address Px [Nx] and a stored sector size Sx) that is corresponded to the logical page address Lk that has been calculated in the step 501 (step 901). The FM controller 103 reads the compressed base data (the base data that has been compressed) of the logical page Lk from a physical area that is indicated by the base data stored destination 420, and restores the base data (in a plane text state) by decompressing the compressed base data (step 902).

In the next place, the FM controller 103 checks the difference flag 430 that is corresponded to the logical page Lk in the step 903. In the case where the difference flag is "OFF", the processing is transited to the step 904. On the other hand, in the case where the difference flag is "ON", the processing is transited to the step 906.

In the step 904, the FM controller 103 acquires the code part address 460 (a physical address Px [Nx]) that is corresponded to the logical page Lk. The FM controller 103 reads the current code part of the logical page Lk from a physical area that is indicated by the code part address 460, synthesizes the code part with the base data that has been obtained in the step 902, and creates the current user data to the logical page Lk (step 905). After that, the processing is transited to the step 909.

On the other hand in the step 906, in order to obtain the current difference data and the code part, the FM controller 103 acquires the difference data stored destination 440 (a physical address Py [Ny] and a stored sector size Sy) and the code part address 460 (a physical address Py [Ny]) that are corresponded to the logical page Lk. The FM controller 103 reads the compressed difference data of the logical page Lk from a physical area that is indicated by the difference data stored destination 440, and restores the difference data (in a plane text state) by decompressing the compressed difference data (step 907). The FM controller 10 then reads the code part of the logical page Lk from a physical area that is indicated by the code part address 460 (Py [Ny]) that has been obtained in the step 906, calculates an exclusive OR of the base data and the difference data of the logical page Lk, and creates the current user data of the logical page Lk by synthesizing the code part of the logical page Lk that has been read to the calculation result (step 908). After that, the processing is transited to the step 909.

In the step 909, the FM controller 103 rewrites a part of the address Wa that has been specified by the write command with the write data Wd for the current user data of the logical page Lk, and creates the new user data of the logical page Lk.

In the next place, the FM controller 10 then calculates an exclusive OR of the current base data of the logical page Lk and the sector part of the new user data and creates the new difference data of the logical page Lk. The FM controller 103 then compresses the difference data and creates the compressed difference data (step 910). The FM controller 103 then links a code part that has been separated from the new user data to the result data (the compressed difference data) (step 911).

On the other hand, the FM controller 103 compresses the new user data of the logical page Lk and creates the compressed user data (step 912).

The FM controller 103 compares a size of the result data (the compressed difference data+the code part) of the step 911 and a size of the result data (the compressed user data) of the step 912 and selects the result data of smaller size to be written to the flash memory 105 (step 913). In the case where the sizes are equivalent to each other, the result data of the step 912 is selected.

In the case where the result data of the step 911 is selected, since the second forming method is applied to the user data of the logical page Lk, the FM controller 103 sets the difference flag 430 that is corresponded to the logical page address Lk to be "ON". In the case where the result data of the step 912 is selected, since the first forming method is applied to the user data of the logical page Lk, the FM controller 103 sets the difference flag 430 that is corresponded to the logical page address Lk to be "OFF" (step 914).

With that, the partial write processing of a duplication allocation page is terminated, and the processing is transited to the step 509 of FIG. 5.

The processing after the write processing of FIGS. 6 and 7 will be described with reference to the step 505 and subsequent steps of FIG. 5.

In the step 505, the FM controller 103 checks whether the difference flag 430 of the logical page address Lk is set to be "OFF" or "ON" for each of the last steps of the whole write processing of an isolated allocation page and the partial write processing of an isolated allocation page. In the case where the difference flag is "OFF", it means that the first forming method is applied, and the processing is transited to the step 506. On the other hand, in the case where the difference flag is "ON", it means that the second forming method is applied, and the processing is transited to the step 508.

In the step 506, the FM controller 103 updates the base data stored destination 420 that is corresponded to the logical page address Lk to be a physical address and a stored sector size of the new base data (in the compressed state) that has been written to the flash memory 105. The FM controller 103 then invalidates the base pre-update data that remains in the physical address Py [Ny] (step 507). With that, the write command processing is terminated.

In the step 508, the FM controller 103 updates the difference data stored destination 440 that is corresponded to the logical page address Lk to be a physical address and a stored sector size of the new difference data (in the compressed state) that has been written to the flash memory 105. In the case where the difference pre-update data remains in the physical address Py [Ny] (that is, in the case where the difference flag 430 is "ON" before the write processing), the FM controller 103 invalidates the difference data. With that, the write command processing is terminated.

The processing after the write processing of FIGS. 8 and 9 will be described with reference to the step 509 and subsequent steps of FIG. 5.

In the step 509, the FM controller 103 checks whether the difference flag 430 of the logical page address Lk is set to be "OFF" or "ON" for each of the last steps of the whole write processing of a duplication allocation page and the partial write processing of a duplication allocation page. In the case where the difference flag is "OFF", it means that the first forming method of a duplication allocation page is applied, and the processing is transited to the step 510. On the other hand, in the case where the difference flag is "ON", it means that the second forming method of a duplication allocation page is applied, and the processing is transited to the step 514.

In the step 510, the FM controller 103 updates the base data stored destination that is corresponded to the logical page address Lk to be a physical address and a stored sector size of the new base data (in the compressed state) that has been written to the flash memory 105. By this configuration, since the number of logical pages that share the pre-update base data that remains in the physical address Py [Ny] is decreased by 1, the FM controller 103 subtracts 1 from a value of the shared count that is corresponded to the pre-update base data for the duplication count table 470 (step 511). Moreover, in the case where a value of the shared count becomes 0 by this operation of subtraction, since a logical page that utilizes the pre-update base data does not exist, the FM controller 103 invalidates the pre-update base data (step 512). With that, the write command processing is terminated. The FM controller 103 then modifies the logical page Lk to be an isolated allocation page by setting the duplication flag 450 that is corresponded to the logical page address Lk to be "OFF" (step 513). With that, the write command processing is terminated.

In the step 514, the FM controller 103 updates the difference data stored destination 440 that is corresponded to the logical page address Lk to be a physical address and a stored sector size of the new difference data (in the compressed state) that has been written to the flash memory 105, updates the code part address 460 that is corresponded to the logical page address Lk to be a physical address of the new code part that has been written to the flash memory 105, and invalidates the code part before an update that remains in the physical address Py [Ny] (step 512). In the case where the pre-update difference data remains in the physical address Py [Ny] (that is, in the case where the difference flag 430 is "ON" before the write processing), the FM controller 103 also invalidates the pre-update difference data. With that, the write command processing is terminated.

In accordance with the present embodiment, in the case where a difference of the pre-update user data and the post-update user data is less, the difference data that is an exclusive OR of the pre-update user data and the post-update user data comes in predisposed to be compressed and written without invalidating the pre-update user data and without writing the post-update user data itself. By this configuration, a writing amount of the flash memory 105 can be reduced, thereby providing for a longer operating life of the flash memory 105.

For the present embodiment, a method for creating the difference data by an exclusive OR is adopted. The method includes a feature in which it is not necessary that each of locations of updated parts is managed individually even if a lot of parts that have been updated exists in one physical page. By this configuration, a size of the management information related to the difference, thereby saving a memory capacity in effective manner.

Some modified examples can also be implemented for at least one of the whole write processing of an isolated allocation page 600, the partial write processing of an isolated allocation page 700, the whole write processing of a duplication allocation page 800, and the partial write processing of a duplication allocation page 900.

For the first modified example, in the case where there is not a compression effect of data (at least one of the base data and the difference data), the data in a plane text state can also be written to the flash memory 105. In the case where the data is written in a plane text state, a time for executing the decompression processing can be reduced when the data is read, thereby improving the read response performance of the FM module 100.

For the second modified example, in the case where the difference data that has been created by the XOR circuit 107 is data that is composed of all zero values (predetermined bit values or predetermined byte values), it is also possible that the FM controller 103 does not execute subsequent compression processing, does not write the difference data to the flash memory 105, sets the difference flag 430 that is corresponded to the logical page Lk to be "OFF" (selects the first forming method in which the difference data is not used), and terminates the write command processing in the very short term. By this configuration, a writing amount of the flash memory 105 can be reduced. In addition, a compression processing time of the difference data and a time for writing to the flash memory 105 can also be reduced, thereby also improving the write command performance of the FM module 100.

For the third modified example, in the case where the difference data that has been created by the XOR circuit 107 is data in which the number of non-zero values is equivalent to or less than the predetermined number (that is, updated parts are less), it is also possible that the FM controller 103 sets the difference flag 430 that is corresponded to the logical page Lk to be "ON" (selects the second forming method in which the difference data is used) and terminates the write command processing without executing the compression processing of the user data (the updated data). In other words, the FM controller 103 can terminate the write command processing without creating the compressed user data and without executing the comparison that has been described above.

For the fourth modified example, in the case where a size of a sector part of the user data is equivalent to or less than the predetermined size (that is, updated parts are less), it is also possible that the FM controller 103 sets the difference flag 430 that is corresponded to the logical page Lk to be "ON" (selects the second forming method in which the difference data is used) and terminates the write command processing without executing the compression processing of the user data (the sector part). In other words, the FM controller 103 can terminate the write command processing without creating the compressed user data and without executing the comparison that has been described above.

For the fifth modified example, in the case where the write data that conforms to the write command is a fixed pattern of all zeros or the like (for example, data for a format), it is also possible that the FM controller 103 sets the difference flag 430 that is corresponded to the logical page Lk to be "OFF" (selects the first forming method in which the difference data is not used) and terminates the write command processing without creating the difference data and without executing the compression processing.

While the some preferred embodiments and modified examples in accordance with the present invention have been described above, the embodiments are examples for describing the present invention and the scope of the present invention is not limited to the above embodiments. In other words, the present invention can also be executed by other modes of every sort and kind.

For example, it is not necessary to execute a comparison of data sizes for at least one of an isolated allocation page and a duplication allocation page. For example, it is also possible that the first forming method is selected after the second method is selected a certain number of times, and after that, the second method is selected a certain number of times again.

For example, an apparatus that includes the FM module 100 is not limited to the storage apparatus 1400 and can also be the host 1421 as shown in FIG. 16. For example, the host 1421 (for example, a server apparatus) can also be provided with the I/F 1604, the FM module 100, and the CPU 1602 that is coupled to them (moreover, the host 1421 can also be provided with a storage device (such as a DRAM) of a type other than that of the FM module 100. The whole or a part of the FM module 100 can be used as a cache memory of data that is input or output by the host 1421. In FIG. 16, the higher-level apparatus of the FM module 100 may be the CPU 1602. Since the host 1421 executes an application for rewriting data of a cache memory on a frequent basis in some cases, the FM module 100 in accordance with the present embodiment capable of reducing a writing amount of the flash memory 105 is effective for the host 1421.

REFERENCE SIGNS LIST

100: FM module
103: FM controller
104: Compression decompression circuit
105: Flash memory
106: DRAM
107: XOR circuit

The invention claimed is:

1. A storage device coupled to a storage controller, comprising:
a storage medium; and
a medium controller, operatively coupled with the storage medium, the medium controller configured to control an I/O (Input/Output) to the storage medium and to provide a logical space based on the storage medium to the storage controller,
the logical space including a plurality of logical areas,
a base data range of addresses for each logical area existing in the storage medium, and
the medium controller being further configured to
receive a write command, from the storage controller, that specifies a write destination logical address and includes write data,
read base data from the base data range that corresponds to a write destination logical area, wherein the write logical area is identified by the write destination logical address,
create difference data that is an exclusive OR of bits of the base data and bits of the write data,
create compressed difference data by compressing the difference data,
write the compressed difference data to the storage medium, and
associate a difference range with the write destination logical area, wherein the difference range is a range of addresses in which the compressed difference data has been written.

2. The storage device according to claim 1, wherein the medium controller is configured to
create compressed second data by compressing the write data, and
if third data that includes the compressed difference data is smaller in data size than the compressed second data, write the third data to the storage medium, and
wherein the third data is either;
the compressed difference data, or
data that is the compressed difference data and a code part that is formed from one or more guarantee codes in the base data.

3. The storage device according to claim 2, wherein:
the medium controller is configured to write the compressed second data to the storage medium if the compressed second data is smaller in data size than the third data, and the medium controller is configured to update the base range of for each logical area of the write destination logical area to a compressed second range wherein the compressed second range is a range of addresses in which the compressed second data has been written.

4. The storage device according to claim 3, wherein the medium controller is configured to write the compressed second data to the storage medium, in a case where a data size of the compressed second data is equal to a data size of that of the third data.

5. The storage device according to claim 2, wherein the medium controller is configured to update the difference data range for each logical area of the write destination logical area to a third range, wherein the third range is a range of addresses in which the third data has been written.

6. The storage device according to claim 1, wherein
the storage medium includes a plurality of physical areas, in which the input and output of data are executed on a physical area of the plurality of physical areas.

7. The storage device according to claim 1, wherein:
the storage medium includes a plurality of physical areas, in which the input and output of data are executed on a physical area of the plurality of physical areas,
updated data that is created based on the base data and the write data,
wherein on a condition that the data that is created is of a data size less than a size of a physical area, the data that is created based on updated data that is created by an exclusive OR of bits of the base data and the bits of the difference data that is associated with the write destination logical area and the write data,
wherein on a condition that the data is created is of a data size less than a size of a physical area, the difference data is an exclusive OR of bits of the base data and bits of the updated data.

8. The storage device according to claim 1, wherein
the storage medium includes a plurality of physical areas, in which the input and output of data are executed on a physical area of the plurality of physical areas,
two or more logical areas that are associated with a same base data range, wherein the two or more logical areas include the write destination logical area,
the medium controller is configured to write third data that is the compressed difference data and a code part that is formed from one or more guarantee codes of the write data.

9. The storage device according to claim 8, wherein the medium controller is configured to
create compressed write data by compressing the write data,
if the third data is smaller in data size than the compressed write data, write the third data to the storage medium, and
if the compressed write data is smaller in data size than the third data, write the compressed write data to the storage medium.

10. The storage device according to claim 1, wherein
the storage medium includes a plurality of physical areas, in which the input and output of data are executed on a physical area of the plurality of physical areas,
two or more logical areas that are associated with a same base data range, the two or more logical areas include the write destination logical area,
updated data is data that is created from either;
a base sector data part and a stored code part that is formed from one or more guarantee codes, or an exclusive OR of bits of the base sector data part and the bits of the difference data,
the difference data is an exclusive OR of bits of the updated data and the base data, and
the medium controller is configured to write third data to the storage medium, the third data includes the compressed difference data and a code part that is formed from one or more guarantee codes of the updated data.

11. The storage device according to claim 10, wherein the medium controller is configured to
create compressed updated data by compressing the updated data; and
if the third data is smaller in data size than the compressed updated data, write the third data to the storage medium, or
if the compressed updated data is smaller in data size than the third data, write the compressed updated data to the storage medium.

12. The storage device according to claim 2, wherein the medium controller is configured to write the third data to the storage medium, if a predetermined data size of the third data is equal or larger than a predetermined data size of the difference data.

13. The storage device according to claim 2, wherein the medium controller is configured to write the compressed second data to the storage medium, if all of the difference data is data that is equal to a predetermined data size or the write data is data of a predetermined data pattern.

14. An apparatus comprising:
a storage device; and
a processor, operatively coupled with the storage device, the processor configured to control an input/output (I/O) to the storage device,
the storage device including a storage medium and a medium controller that is configured to control an I/O to the storage medium and to provide a logical space based on the storage medium to the processor,
the logical space including a plurality of logical areas,
a base data range of addresses for each logical area exists in the storage medium, and
the medium controller being further configured to
receive a write command, from the processor, that specifies a write destination logical address and includes write data,
read base data from the base data range that corresponds to a write destination logical area to which the write destination logical address belongs,
create difference data that is an exclusive OR of bits of the base data and bits of the write,
create compressed difference data by compressing the difference data,
write the compressed difference data to the storage medium, and
associate a difference range with the write destination logical area, wherein the difference range is a range of addresses in which the compressed difference data has been written.

15. A storage control method comprising:
providing a logical space to a storage controller, the logical space is a space on a storage medium and that includes a plurality of logical areas;
receiving a write command, from the storage controller, wherein the write command specifies a write destination logical address and write data;
reading base data from the base range, wherein the base range corresponds to addresses of a write destination logical area, creating difference data that is an exclusive OR of bits of the base data and bits of the write data;

creating compressed difference data by compressing the difference data;

writing the compressed difference data to the storage medium; and associating a difference range with the write destination logical area, wherein the difference range is a range of addresses in which the compressed difference data has been written.

* * * * *